(12) United States Patent
Tabata

(10) Patent No.: US 11,587,868 B2
(45) Date of Patent: Feb. 21, 2023

(54) SEMICONDUCTOR MEMORY DEVICE

(71) Applicant: Kioxia Corporation, Tokyo (JP)

(72) Inventor: Koji Tabata, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/464,784

(22) Filed: Sep. 2, 2021

(65) Prior Publication Data

US 2022/0262724 A1    Aug. 18, 2022

(30) Foreign Application Priority Data

Feb. 17, 2021    (JP) .............................. JP2021-023360

(51) Int. Cl.
| | |
|---|---|
| *G11C 16/04* | (2006.01) |
| *H01L 23/522* | (2006.01) |
| *H01L 27/11529* | (2017.01) |
| *H01L 27/11556* | (2017.01) |
| *H01L 27/11573* | (2017.01) |
| *G11C 16/26* | (2006.01) |
| *G11C 16/10* | (2006.01) |
| *G11C 16/24* | (2006.01) |
| *H01L 27/11582* | (2017.01) |

(52) U.S. Cl.
CPC ...... *H01L 23/5226* (2013.01); *G11C 16/0483* (2013.01); *G11C 16/10* (2013.01); *G11C 16/24* (2013.01); *G11C 16/26* (2013.01); *H01L 27/11529* (2013.01); *H01L 27/11556* (2013.01); *H01L 27/11573* (2013.01); *H01L 27/11582* (2013.01)

(58) Field of Classification Search
CPC ........... H01L 23/5226; H01L 27/11529; H01L 27/11556; H01L 27/11573; H01L 27/11582; G11C 16/0483; G11C 16/10; G11C 16/24; G11C 16/26; G11C 16/32; G11C 16/08
USPC ...................................................... 365/185.17
See application file for complete search history.

(56) References Cited

U.S. PATENT DOCUMENTS

| | | | |
|---|---|---|---|
| 10,014,054 B2 * | 7/2018 | Maejima | ........... H01L 27/11573 |
| 10,204,692 B1 * | 2/2019 | Kamata | .............. G11C 16/3459 |
| 10,276,241 B2 | 4/2019 | Maejima | |

(Continued)

FOREIGN PATENT DOCUMENTS

| | | |
|---|---|---|
| JP | 2015164083 A | 9/2015 |
| JP | 2018026518 A | 2/2018 |
| JP | 2020145372 A | 9/2020 |

*Primary Examiner* — Tha-O H Bui
(74) *Attorney, Agent, or Firm* — Holtz, Holtz & Volek PC

(57) ABSTRACT

A semiconductor memory device includes a substrate; a plurality of first conductive layers arranged in a first direction; a first semiconductor column; a first bit line being disposed at a position overlapping the first semiconductor column viewed in the first direction; a first wiring including a part overlapping the first bit line viewed in the first direction; and a second wiring including a part overlapping the first bit line viewed in the first direction. When a period in which a voltage of the first wiring transitions from a high to a low voltage state is assumed to be a first period, and when a period in which a voltage of the second wiring transitions from a low to a high voltage state is assumed to be a second period, at least a part of the second period overlaps at least a part of the first period.

16 Claims, 23 Drawing Sheets

(56) References Cited

U.S. PATENT DOCUMENTS

| | | |
|---|---|---|
| 10,381,371 B2 | 8/2019 | Ogawa et al. |
| 10,672,782 B2 | 6/2020 | Utsumi |
| 10,891,987 B2 | 1/2021 | Takagiwa |
| 2001/0052599 A1* | 12/2001 | Ooishi ................ G11C 29/848 257/63 |
| 2017/0309339 A1* | 10/2017 | Hsiung ................ G11C 16/10 |

* cited by examiner

SEMICONDUCTOR MEMORY DEVICE

CROSS-REFERENCE TO RELATED APPLICATIONS

This application is based upon and claims the benefit of Japanese Patent Application No. 2021-023360, filed on Feb. 17, 2021, the entire contents of which are incorporated herein by reference.

BACKGROUND

Field

Embodiments described herein relate generally to a semiconductor memory device.

Description of the Related Art

There has been known a semiconductor memory device that includes a semiconductor substrate; a plurality of conductive layers stacked in a direction intersecting with a surface of the semiconductor substrate; a semiconductor column extending in the direction intersecting with the surface of the semiconductor substrate and being opposed to the plurality of conductive layers; and a gate insulating film disposed between the conductive layers and the semiconductor column.

DETAILED DESCRIPTION

Figure 1:
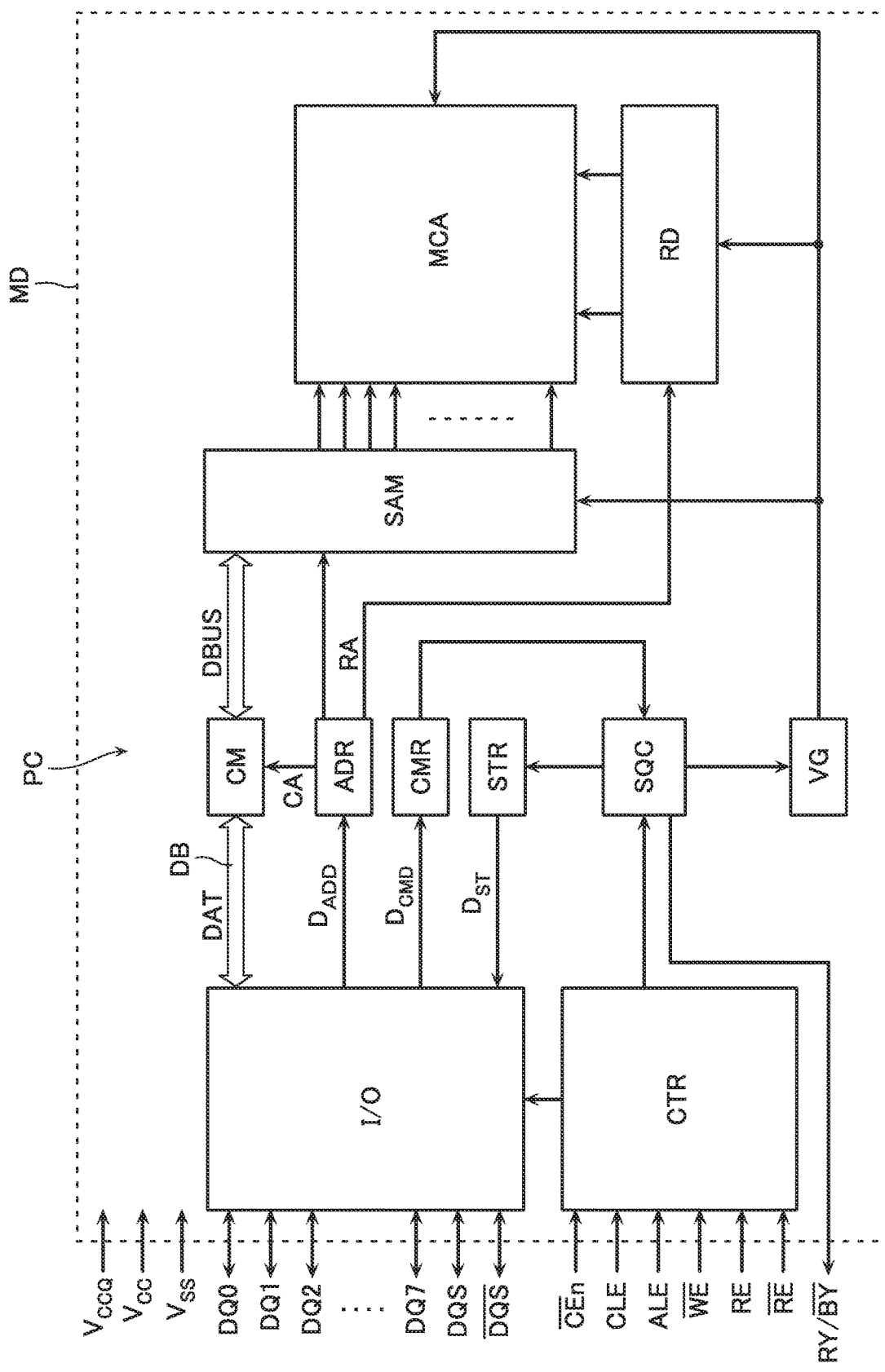
FIG. 1 is a schematic block diagram illustrating a configuration of a memory die MD according to an embodiment.

A semiconductor memory device according to one embodiment comprises a substrate; a plurality of first conductive layers arranged in a first direction intersecting with a surface of the substrate, the plurality of first conductive layers extending in a second direction intersecting with the first direction; a first semiconductor column extending in the first direction and being opposed to the plurality of first conductive layers; a first bit line extending in a third direction intersecting with the first direction and the second direction, the first bit line being disposed at a position overlapping the first semiconductor column viewed in the first direction; a first wiring including a part overlapping the first bit line viewed in the first direction; and a second wiring including a part overlapping the first bit line viewed in the first direction. When a predetermined period in which a voltage of the first wiring transitions from a high voltage state to a low voltage state is assumed to be a first period, and when a predetermined period in which a voltage of the second wiring transitions from a low voltage state to a high voltage state is assumed to be a second period, at least a part of the second period overlaps at least a part of the first period.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

In this specification, a predetermined direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Circuit Configuration of Memory Die MD]

Figure 2:
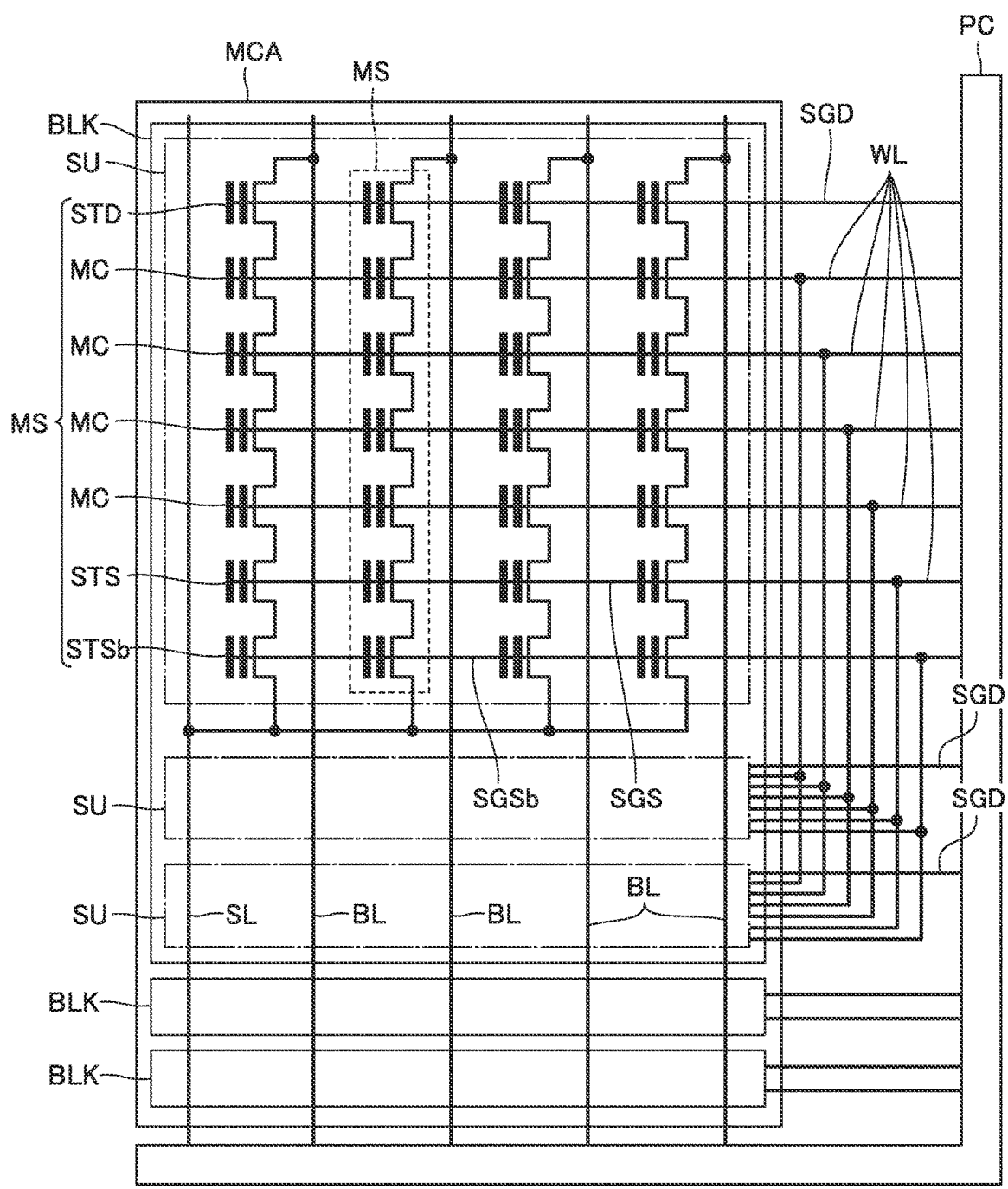
FIG. 2 is a schematic circuit diagram illustrating a configuration of a memory cell array MCA.
Figure 3:
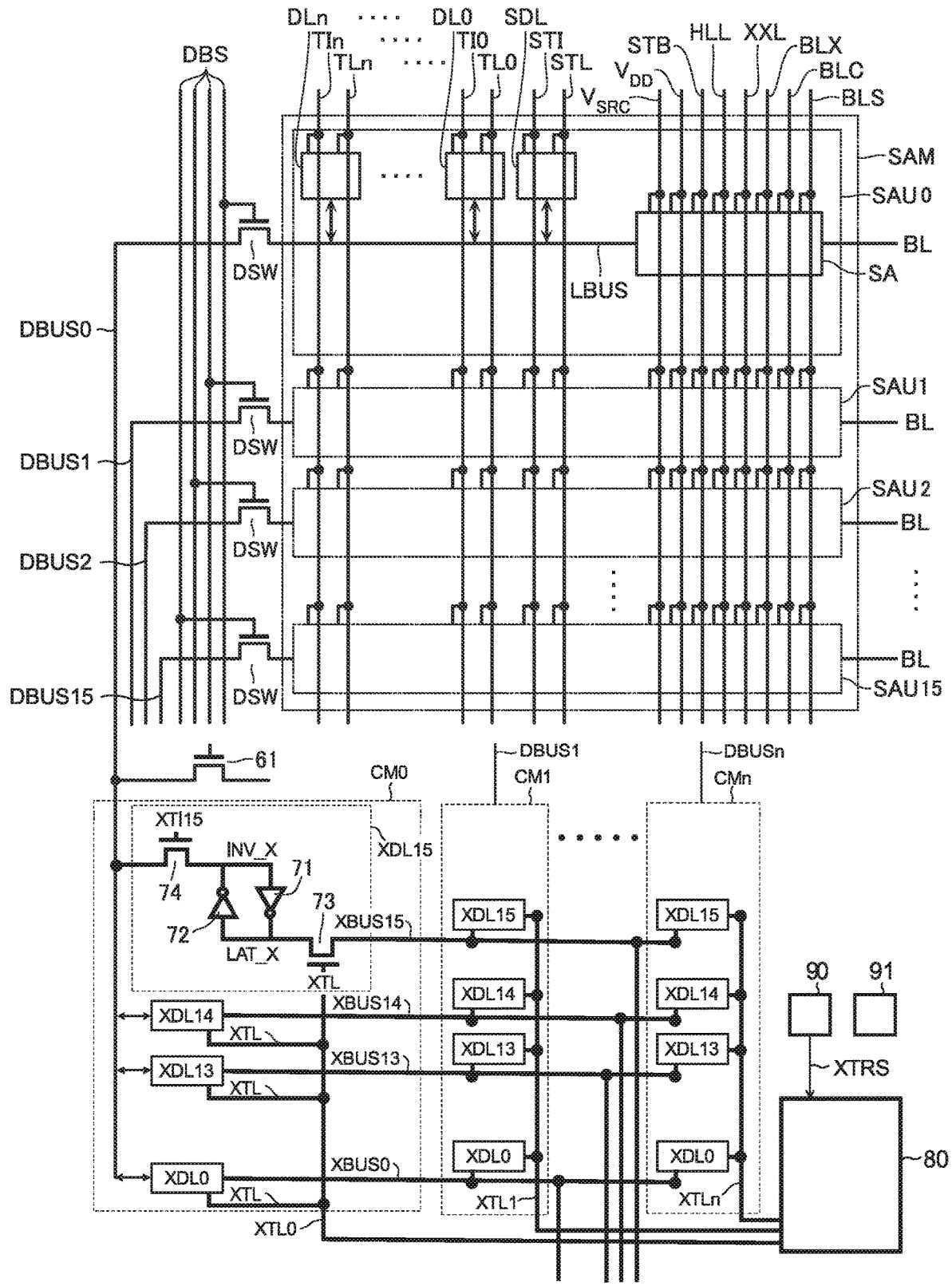
FIG. 3 is a schematic circuit diagram illustrating configurations of a sense amplifier module SAM, a cache memory CM, and a conversion circuit 80.
Figure 4:
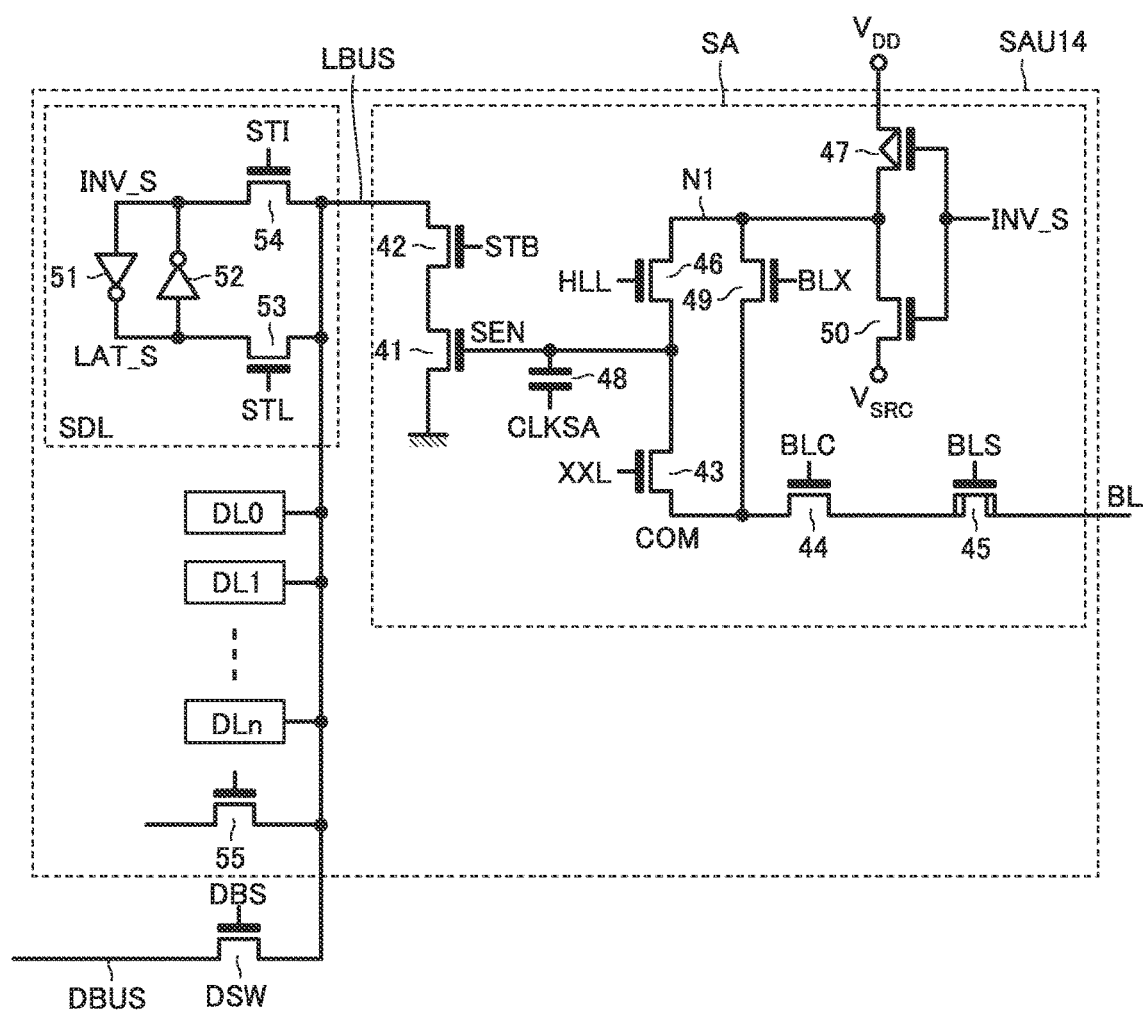
FIG. 4 is a schematic circuit diagram illustrating a configuration a sense amplifier unit SAU of the sense amplifier module SAM.

FIG. 1 is a schematic block diagram illustrating a configuration of a memory die MD according to the first embodiment. FIG. 2 to FIG. 4 are schematic circuit diagrams illustrating configurations of respective parts of the memory die MD.

FIG. 1 illustrates a plurality of control terminals and the like. These plurality of control terminals are indicated as control terminals corresponding to a high active signal (positive logic signal) in some cases, indicated as control terminals corresponding to a low active signal (negative logic signal) in some cases, and indicated as control terminals corresponding to both the high active signal and the low active signal in some cases. In FIG. 1, a reference sign of the control terminal corresponding to the low active signal includes an over line (overbar). In this specification, a reference sign of the control terminal corresponding to the low active signal includes a slash ("/"). The description of FIG. 1 is an example, and specific aspects are appropriately adjustable. For example, a part of or all of the high active signals can be changed to the low active signals, or a part of or all of the low active signals can be changed to the high active signals.

As illustrated in FIG. 1, the memory die MD includes a memory cell array MCA that stores data, and a peripheral circuit PC connected to the memory cell array MCA. The peripheral circuit PC includes a voltage generation circuit VG and a row decoder RD. As illustrated in FIG. 3, the peripheral circuit PC includes a sense amplifier module SAM, cache memories CM0, CM1, . . . CM15, . . . CMn (hereinafter, cache memories CM0, CM1, . . . CM15, . . . CMn are simply referred to as "cache memory CM" in some cases. Note that n is a natural number), a conversion circuit 80, a data cache control circuit 90, and a data cache inversion control circuit 91. As illustrated in FIG. 1, the peripheral circuit PC includes a sequencer SQC, an address register ADR, a command register CMR, a status register STR, an input/output control circuit I/O, and a logic circuit CTR.

[Circuit Configuration of Memory Cell Array MCA]

As illustrated in FIG. 2, the memory cell array MCA includes a plurality of memory blocks BLK. Each of these plurality of memory blocks BLK includes a plurality of string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL.

The memory string MS includes a drain-side select transistor STD, a plurality of memory cells MC (memory transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb are simply referred to as select transistors (STD, STS, STSb) in some cases.

The memory cell MC is a field-effect type transistor that includes a part of a semiconductor column that functions as a channel region, a gate insulating film including an electric charge accumulating film, and a gate electrode. The memory cell MC has a threshold voltage that varies corresponding to an electric charge amount in the electric charge accumulating film. The memory cell MC stores data of one bit or a plurality of bits. The gate electrodes of the plurality of memory cells MC corresponding to one memory string MS are connected to respective word lines WL. Each of these word lines WL is connected to all the memory strings MS in one memory block BLK in common.

The select transistor (STD, STS, STSb) is a field-effect type transistor that includes a part of the semiconductor column that functions as a channel region, a gate insulating film, and a gate electrode. The gate electrodes of the select transistors (STD, STS, STSb) are connected to the select gate lines (SGD, SGS, SGSb), respectively. The drain-side select gate line SGD is disposed corresponding to a string unit SU, and is commonly connected to all the memory strings MS in one string unit SU. The source-side select gate line SGS is commonly connected to all the memory strings MS in the plurality of string units SU. The source-side select gate line SGSb is commonly connected to all the memory strings MS in the plurality of string units SU.

[Circuit Configuration of Voltage Generation Circuit VG]

The voltage generation circuit VG (FIG. 1) includes, for example, a step down circuit, such as a regulator, and a step up circuit, such as a charge pump circuit. These step down circuit and step up circuit are each connected to voltage supply lines to which a power supply voltage $V_{CC}$ and a ground voltage $V_{SS}$ are supplied. For example, in a read operation, a write operation, and an erase operation to the memory cell array MCA, the voltage generation circuit VG generates a plurality of operating voltages applied to the bit line BL, the source line SL, the word line WL, and the select gate line (SGD, SGS, SGSb) in accordance with a control signal from the sequencer SQC, and simultaneously outputs them to a plurality of voltage supply lines. The operating voltages output from the voltage supply lines are adjusted in accordance with the control signal from the sequencer SQC as necessary.

[Circuit Configuration of Row Decoder RD]

The row decoder RD (FIG. 1) includes, for example, a decode circuit and a switch circuit. The decode circuit decodes a row address RA latched by the address register ADR. The switch circuit electrically conducts the word line WL and the select gate line (SGD, SGS, SGSb) corresponding to the row address RA with the corresponding voltage supply lines in accordance with the output signal of the decode circuit. [Circuit Configuration of Sense Amplifier Module SAM]

For example, as illustrated in FIG. 3, the sense amplifier module SAM includes a plurality of sense amplifier units SAU0 to SAU15 corresponding to a plurality of bit lines BL. The sense amplifier units SAU0 to SAU15 each include a sense amplifier SA connected to the bit line BL, a wiring LBUS connected to the sense amplifier SA, latch circuits SDL, DL0 to DLn (n is a natural number) connected to a wiring LBUS, and a charge transistor 55 (FIG. 4) for precharging connected to the wiring LBUS. The wirings LBUS in the sense amplifier units SAU0 to SAU15 are, for example, connected to wirings DBUS0 to DBUS15, respectively (hereinafter, wirings DBUS0 to DBUS15 are simply referred to as "wiring DBUS") via the switch transistors DSW. The wirings DBUS0 to DBUS15 are each connected to a charge transistor 61 for precharging.

As illustrated in FIG. 4, the sense amplifier SA includes a sense transistor 41. The sense transistor 41 discharges electric charges of the wiring LBUS according to a current flowed in the bit line BL. A source electrode of the sense transistor 41 is connected to the voltage supply line to which the ground voltage $V_{SS}$ is supplied. A drain electrode is connected to the wiring LBUS via a switch transistor 42. A gate electrode is connected to the bit line BL via a sense node SEN, a discharge transistor 43, a node COM, a clamp transistor 44, and a high breakdown voltage transistor 45. Note that the sense node SEN is connected to an internal control signal line CLKSA via a capacitor 48.

The sense amplifier SA includes a voltage transfer circuit. The voltage transfer circuit selectively electrically conducts the node COM and the sense node SEN with a voltage supply line to which a voltage $V_{DD}$ is supplied or a voltage supply line to which a voltage $V_{SRC}$ is supplied in accordance with data latched by the latch circuit SDL. This voltage transfer circuit includes a node N1, a charge transistor 46 connected between the node N1 and the sense node SEN, a charge transistor 49 connected between the node N1 and the node COM, a charge transistor 47 connected between the node N1 and the voltage supply line to which the voltage $V_{DD}$ is supplied, and a discharge transistor 50 connected between the node N1 and the voltage supply line to which the voltage $V_{SRC}$ is supplied. Note that gate electrodes of the charge transistor 47 and the discharge transistor 50 are connected to a node INV_S of the latch circuit SDL in common.

Note that the sense transistor 41, the switch transistor 42, the discharge transistor 43, the clamp transistor 44, the charge transistor 46, the charge transistor 49, and the discharge transistor 50 are, for example, enhancement type NMOS transistors. The high breakdown voltage transistor 45 is, for example, a depletion type NMOS transistor. The charge transistor 47 is, for example, a PMOS transistor.

The switch transistor 42 includes a gate electrode to which a control signal STB is input. The discharge transistor 43 includes a gate electrode to which a control signal XXL is input. The clamp transistor 44 includes a gate electrode to which a control signal BLC is input. The high breakdown voltage transistor 45 includes a gate electrode to which a control signal BLS is input. The charge transistor 46 includes a gate electrode to which a control signal HLL is input. The charge transistor 49 includes a gate electrode to which a control signal BLX is input. These control signals STB, XXL, BLC, BLS, HLL, and BLX are output from the sequencer SQC.

The latch circuit SDL includes nodes LAT_S, INV_S, an inverter 51 including an output terminal connected to the node LAT_S and an input terminal connected to the node INV_S, an inverter 52 including an input terminal connected to the node LAT_S and an output terminal connected to the node INV_S, a switch transistor 53 connected to the node LAT_S and the wiring LBUS, and a switch transistor 54 connected to the node INV_S and the wiring LBUS. The switch transistors 53 and 54 are, for example, NMOS transistors. The switch transistor 53 includes a gate electrode to which a control signal STL output from the sequencer SQC is input. To the switch transistor 54, a control signal STI output from the sequencer SQC is input.

The latch circuits DL0 to DLn are configured approximately similarly to the latch circuit SDL. However, as described above, the node INV_S of the latch circuit SDL is electrically conducted with the gate electrodes of the charge transistor 47 and the discharge transistor 50 in the sense amplifier SA. The latch circuits DL0 to DLn are different from the latch circuit SDL in this respect.

The switch transistor DSW is, for example, an NMOS transistor. The switch transistor DSW is connected between the wiring LBUS and the wiring DBUS. A gate electrode of the switch transistor DSW is connected to the sequencer SQC via a signal line DBS (FIG. 3).

Note that, as illustrated in FIG. 3, signal lines that transmit the above-described control signals STB, HLL, XXL, BLX, BLC, and BLS are each connected between all the sense amplifier units SAU included in the sense amplifier module SAM in common. The voltage supply line to which the voltage $V_{DD}$ is supplied and the voltage supply line to which the voltage $V_{SRC}$ is supplied, described above, are also each connected between all the sense amplifier units SAU included in the sense amplifier module SAM in common. Signal lines that transmit the control signal STI and the control signal STL of the latch circuit SDL are also each connected between all the sense amplifier units SAU included in the sense amplifier module SAM in common. Similarly, signal lines TI0 to TIn, TL0 to TLn corresponding to the control signal STI and the control signal STL in the latch circuits DL0 to DLn are each connected between all the sense amplifier units SAU included in the sense amplifier module SAM in common. On the other hand, a plurality of the signal lines DBS described above are disposed corresponding to all the respective sense amplifier units SAU included in the sense amplifier module SAM.

[Circuit Configuration of Cache Memory CM]

For example, as illustrated in FIG. 3, the cache memory CM includes latch circuits XDL0 to XDL15 connected to the wiring DBUS and wirings XBUS0 to XBUS15 (hereinafter, wirings XBUS0 to XBUS15 are simply referred to as "wiring XBUS" in some cases). Pieces of data DAT (FIG. 1) included in the latch circuits XDL0 to XDL15 are sequentially transferred to the sense amplifier module SAM or the input/output control circuit I/O via the wiring DBUS. That is, in the read operation, the data (read data) DAT read by the sense amplifier module SAM is once latched by the latch circuits XDL0 to XDL15, and then, transferred from the latch circuits XDL0 to XDL15 to the input/output control circuit I/O. In the write operation, the data (write data) DAT transferred from the input/output control circuit I/O is once latched by the latch circuits XDL0 to XDL15, and then, transferred from the latch circuits XDL0 to XDL15 to the sense amplifier module SAM.

Each of the latch circuits XDL0 to XDL15 includes nodes LAT_X and INV_X, an inverter 71 including an output terminal connected to the node LAT_X and an input terminal connected to the node INV_X, an inverter 72 including an input terminal connected to the node LAT_X and an output terminal connected to the node INV_X, a switch transistor 73 connected to the node LAT_X and the wiring XBUS, and a switch transistor 74 connected to the node INV_X and the wiring DBUS. The switch transistors 73 and 74 are, for example, NMOS transistors. The switch transistors 73 of the latch circuits XDL0 to XDL15 include gate electrodes to which control signals XTL0 to XTL15 output from the conversion circuit 80 are input. Although the illustration is omitted, the switch transistors 74 of the latch circuits XDL0 to XDL15 include gate electrodes to which control signals XTI0 to XTI15 output from the conversion circuit 80 are input.

In the input/output of data in the latch circuits XDL0 to XDL15, the control signal XTL is input to the gate electrodes of the switch transistors 73 in the latch circuits XDL0 to XDL15, any of the switch transistors 73 is turned ON.

[Circuit Configuration of Conversion Circuit 80]

In the input/output of data in the latch circuits XDL0 to XDL15, a data cache control signal XTRS output from the data cache control circuit 90 is input to the conversion circuit 80 (FIG. 3). The conversion circuit 80 performs logical arithmetic processing of the data cache control signal XTRS and control signals (not illustrated) and makes one of the control signals XTL0 to XTLn a high voltage state, and the others a low voltage state.

[Circuit Configuration of Data Cache Control Circuit 90]

In the input/output of data in the latch circuits XDL0 to XDL15, the data cache control circuit 90 decodes a column address CA (FIG. 1), and outputs the data cache control signal XTRS in accordance with its result.

[Circuit Configuration of Data Cache Inversion Control Circuit 91]

The data cache inversion control circuit 91 reduces a coupling noise to the bit line BL possibly generated corresponding to the output signal of the data cache control circuit 90. The data cache inversion control circuit 91 may be, for example, a logic circuit connected to an output terminal of the data cache control circuit 90.

[Circuit Configuration of Sequencer SQC]

The sequencer SQC (FIG. 1) outputs an internal control signal to the row decoder RD, the sense amplifier module SAM, and the voltage generation circuit VG in response to command data $D_{CMD}$ latched in a command register CMR. The sequencer SQC outputs status data $D_{ST}$ indicating its own state to the status register STR as necessary.

The sequencer SQC generates a ready/busy signal and outputs the ready/busy signal to a terminal RY//BY. In a period in which the terminal RY//BY is in the low voltage state (busy period), an access to the memory die MD is basically inhibited. In a period in which the terminal RY//BY is in the high voltage state (ready period), the access to the memory die MD is permitted. A signal output from the terminal RY//BY is referred to as a ready/busy signal RY//BY in some cases.

[Circuit Configuration of Input/Output Control Circuit I/O]

The input/output control circuit I/O (FIG. 1) includes data signal input/output terminals DQ0 to DQ7, toggle signal input/output terminals DQS, /DQS, an input circuit, such as a comparator, and an output circuit, such as an Off Chip Driver (OCD) circuit. The input circuit and the output circuit are connected to the data signal input/output terminals DQ0 to DQ7. The input/output control circuit I/O includes a shift register connected to the input circuit and the output circuit, and a buffer circuit. The power supply voltage $V_{CCQ}$ and the ground voltage $V_{SS}$ are each supplied to the input circuit, the output circuit, the shift register, and the buffer circuit. The data input via the data signal input/output terminals DQ0 to DQ7 is output from the buffer circuit to the cache memory CM, the address register ADR, or the command register CMR in response to the internal control signal from the logic circuit CTR. The data output via the data signal input/output terminals DQ0 to DQ7 is input to the buffer circuit from the cache memory CM or the status register STR in response to the internal control signal from the logic circuit CTR.

[Circuit Configuration of Logic Circuit CTR]

The logic circuit CTR (FIG. 1) receives an external control signal via external control terminals /CEn, CLE, ALE, /WE, RE, /RE and outputs the internal control signal to the input/output control circuit I/O in response to the external control signal.

[Structure of Memory Die MD]

Figure 5:
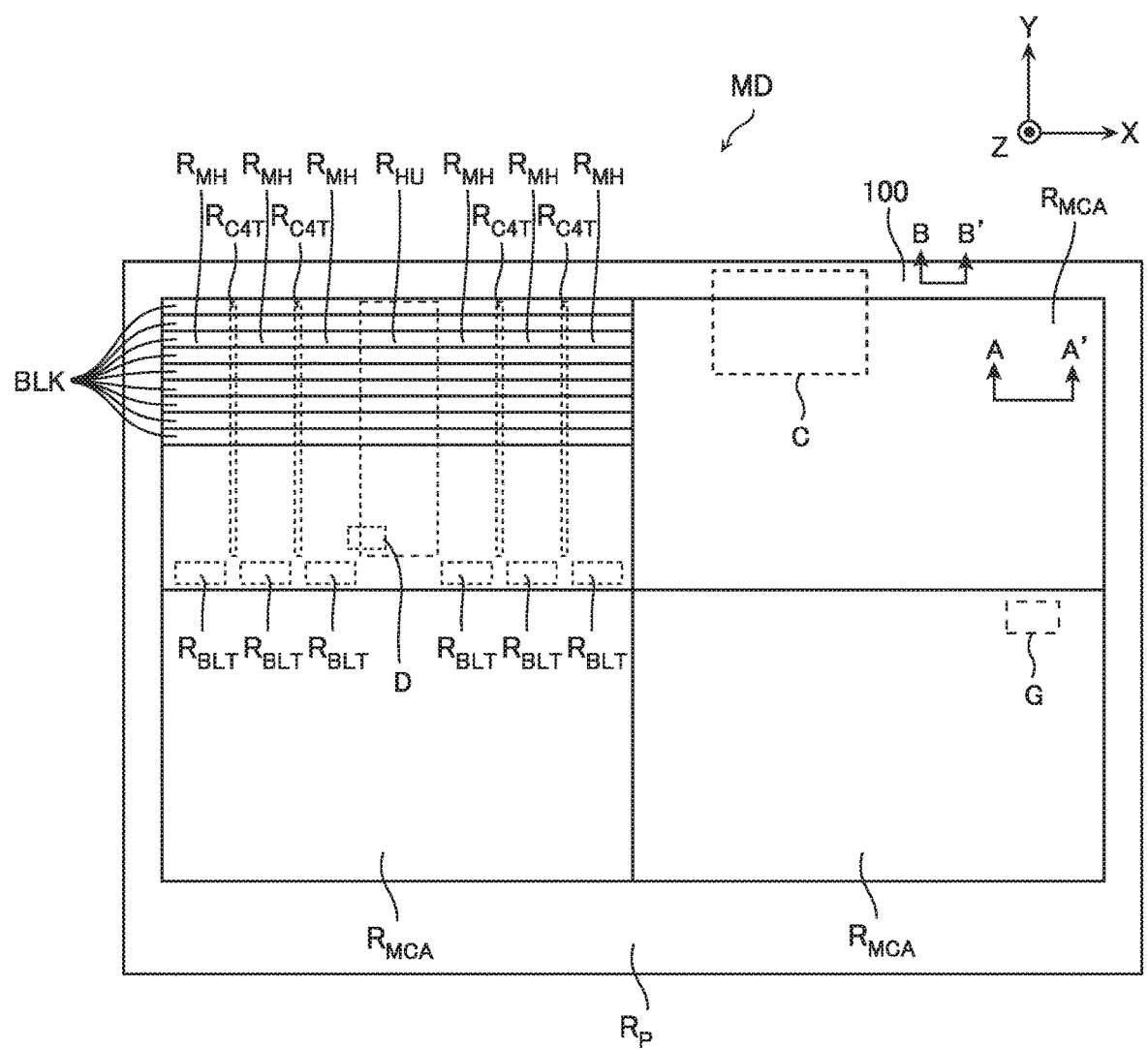
FIG. 5 is a schematic plan view of a memory die MD.
Figure 6:
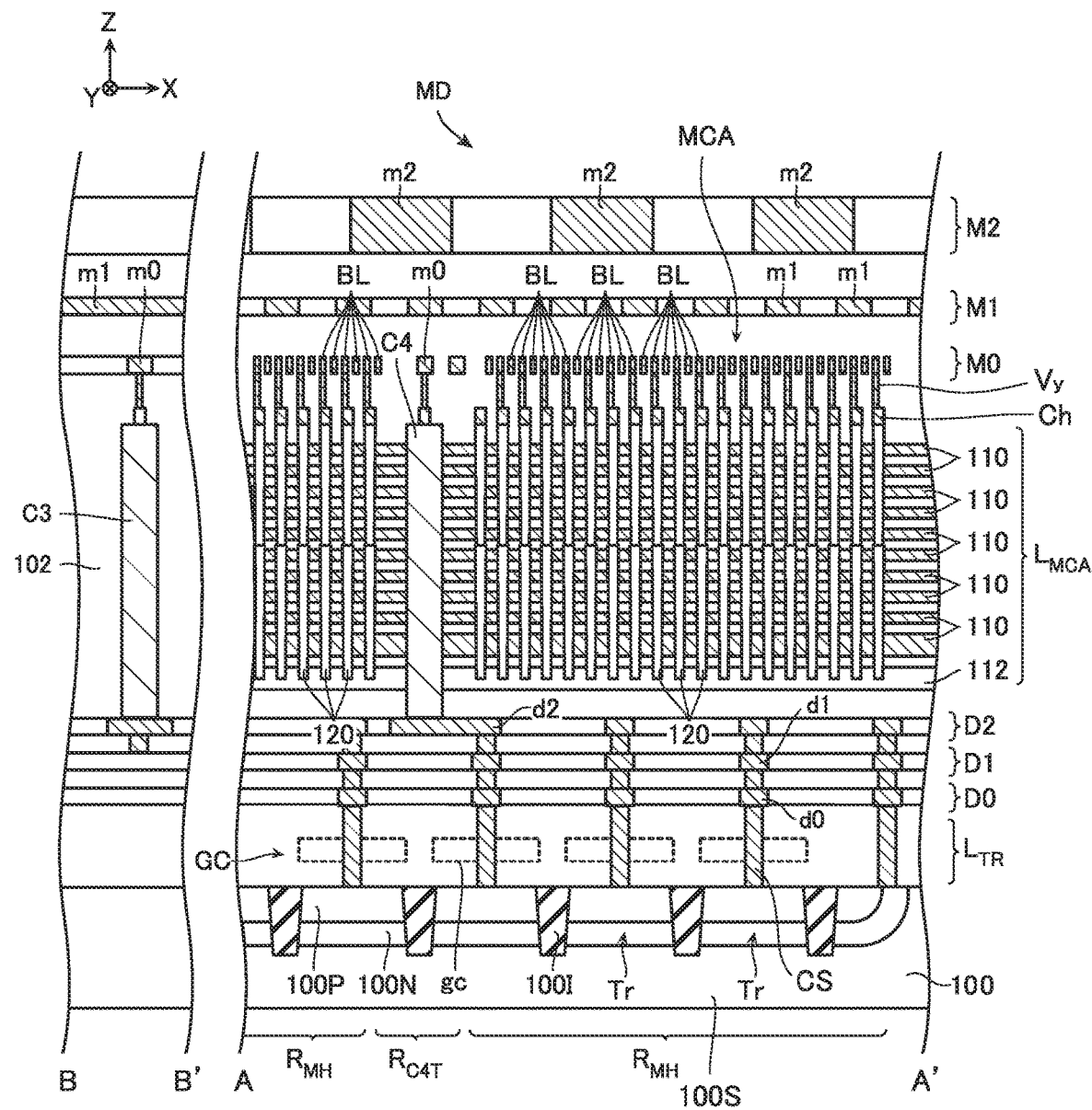
FIG. 6 is a schematic cross-sectional view of the structure illustrated in FIG. 5 taken along a line A-A' and a line B-B' viewed along a direction of arrows.
Figure 7:
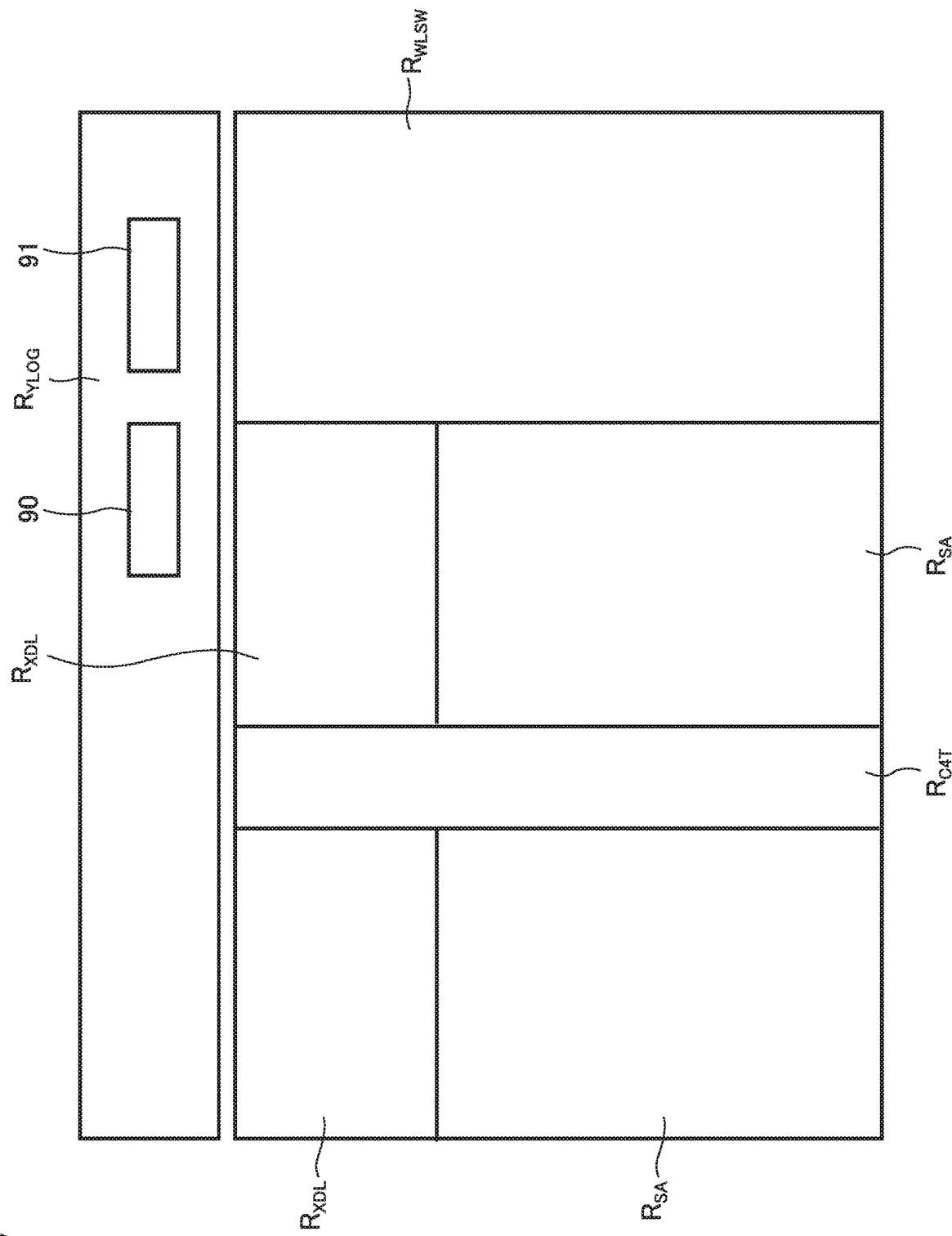
FIG. 7 is a schematic enlarged view of a transistor layer $L_{TR}$ in a part indicated by C in FIG. 5.
Figure 8:
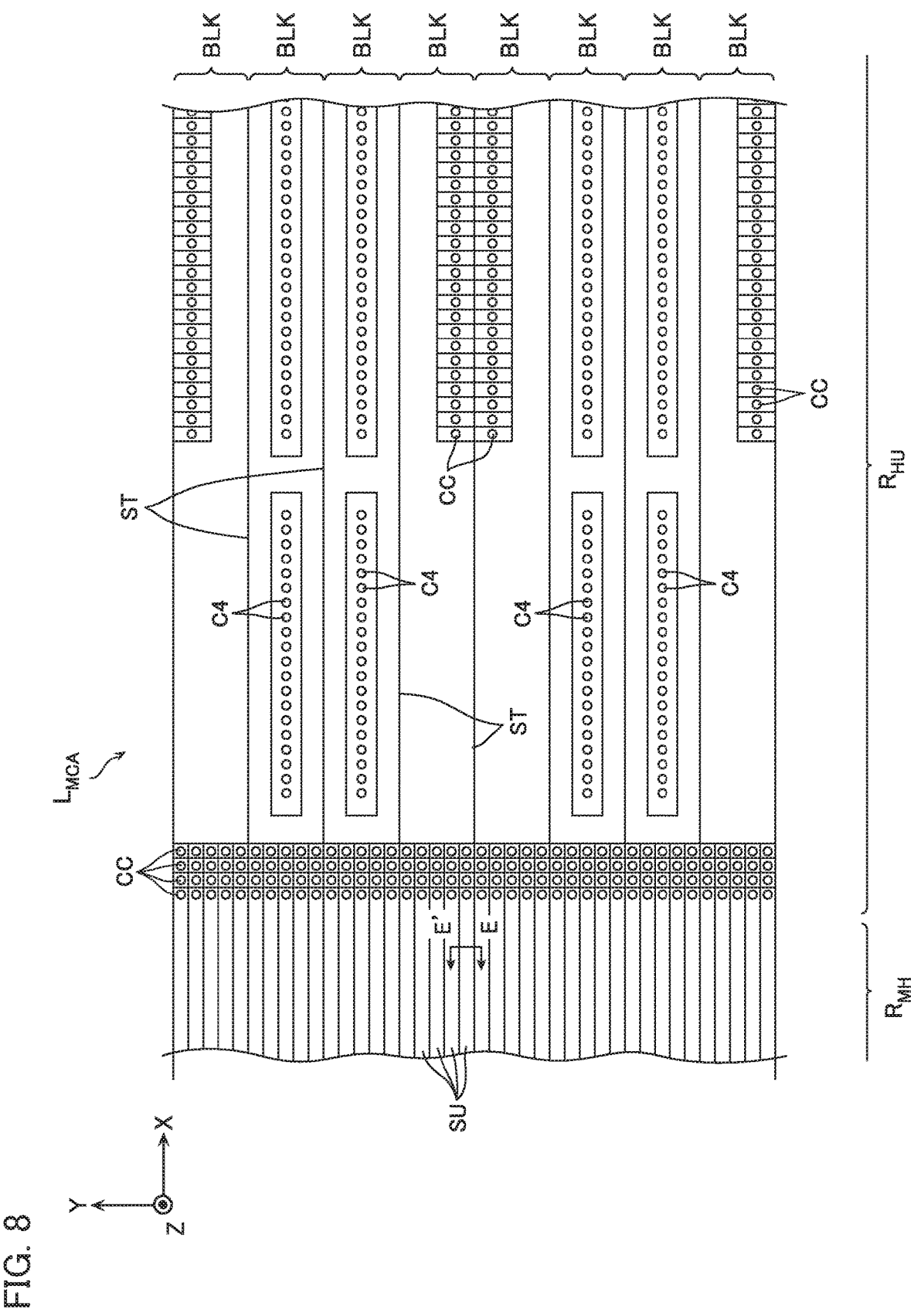
FIG. 8 is a schematic enlarged view of a part indicated by D in FIG. 5.
Figure 9:
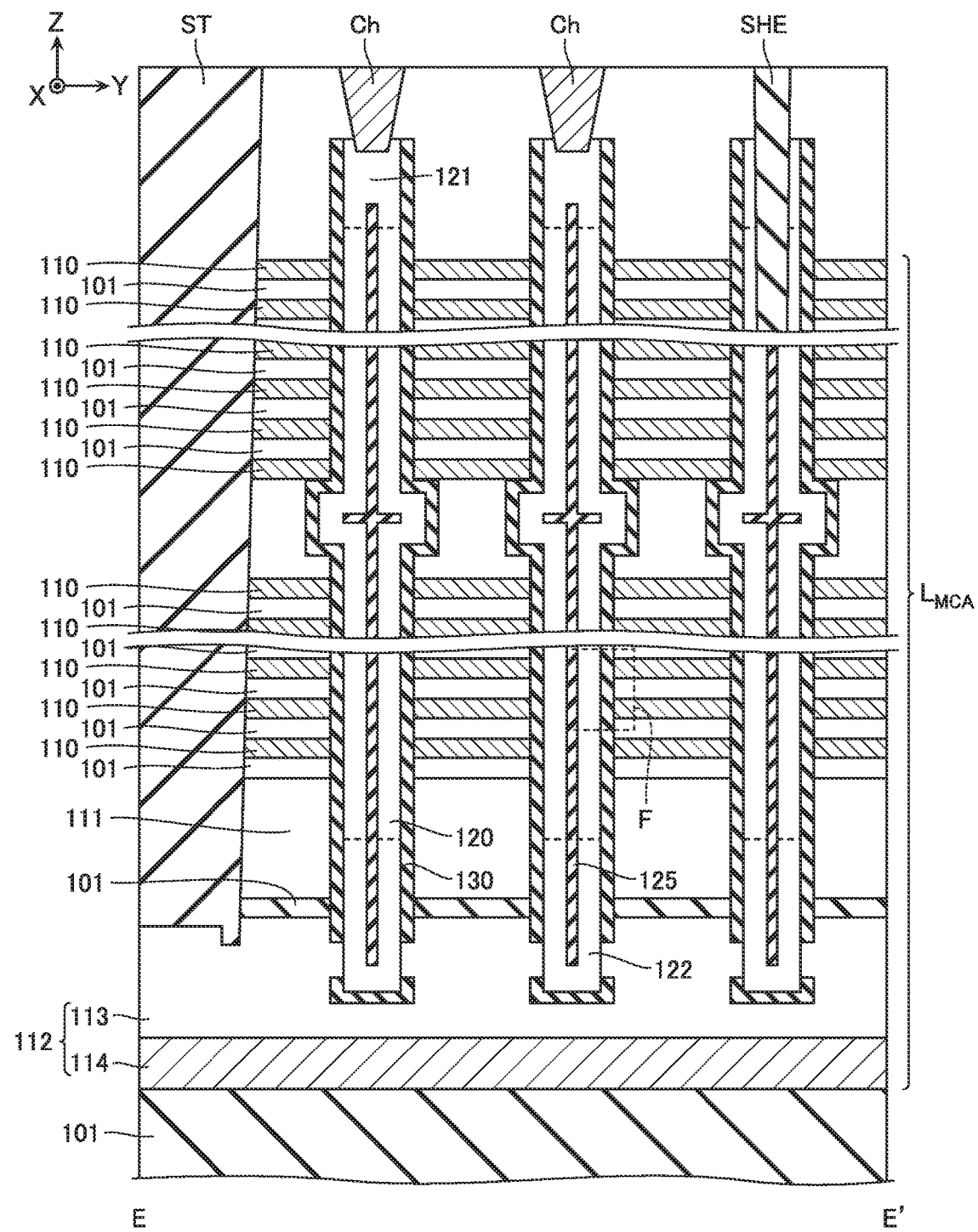
FIG. 9 is a schematic cross-sectional view of the structure illustrated in FIG. 8 taken along a line E-E' viewed along a direction of arrows.
Figure 10:
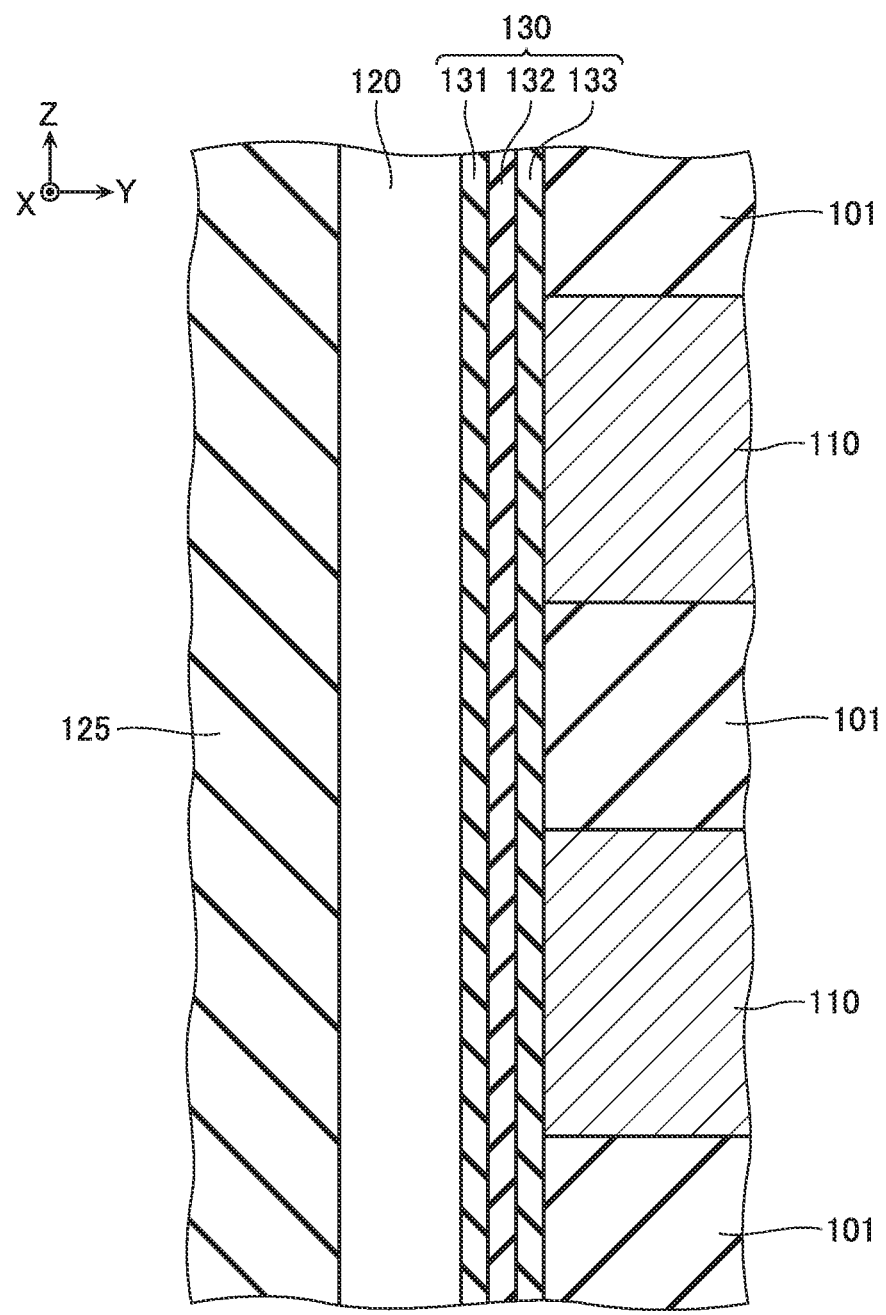
FIG. 10 is a schematic enlarged view of a part indicated by F in FIG. 9.
Figure 11:
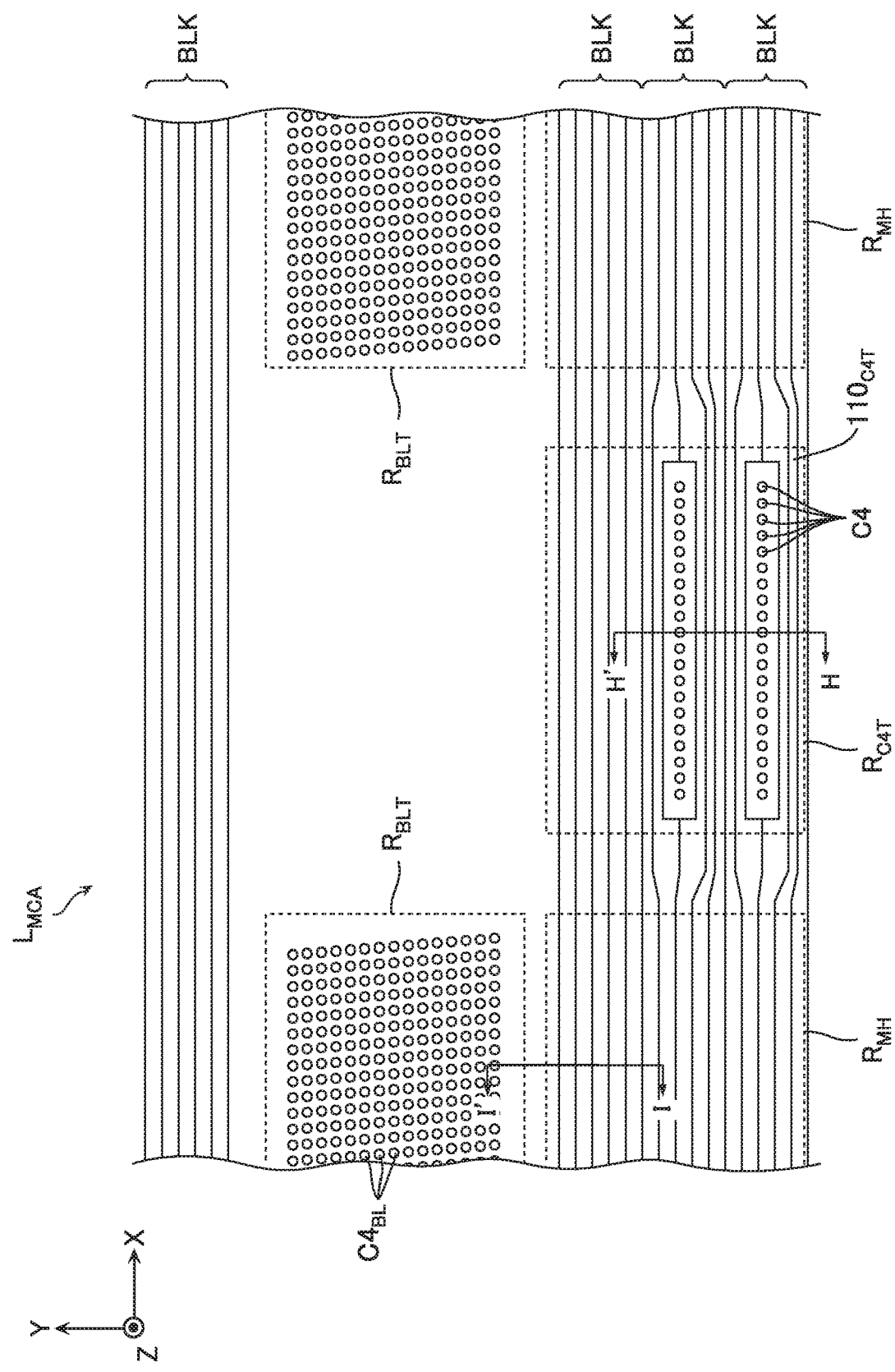
FIG. 11 is a schematic enlarged view of a part indicated by G in FIG. 5.
Figure 12:
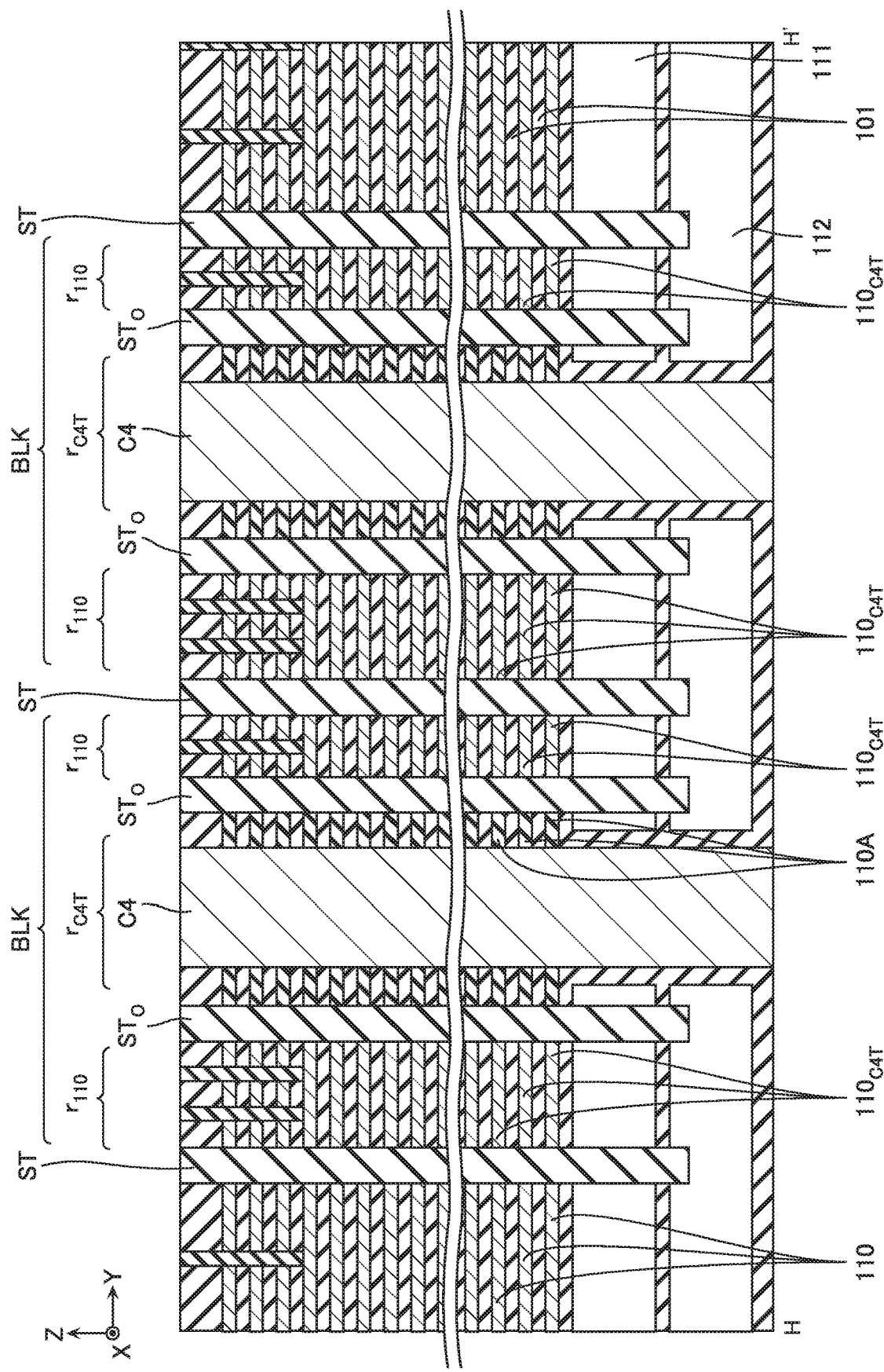
FIG. 12 is a schematic cross-sectional view of the structure illustrated in FIG. 11 taken along a line H-H' viewed along a direction of arrows.
Figure 13:
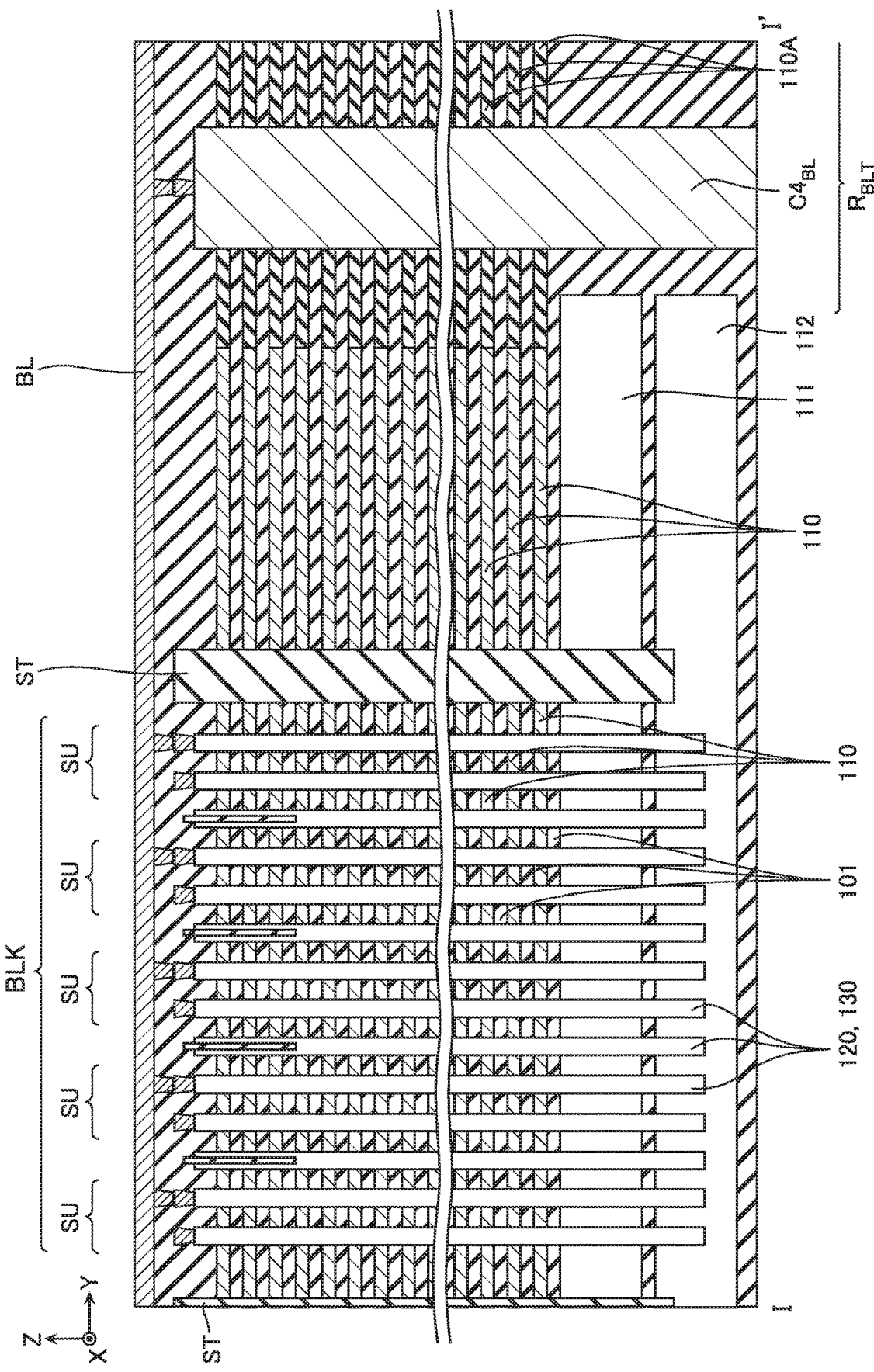
FIG. 13 is a schematic cross-sectional view of the structure illustrated in FIG. 11 taken along a line I-I' viewed along a direction of arrows.
Figure 14:
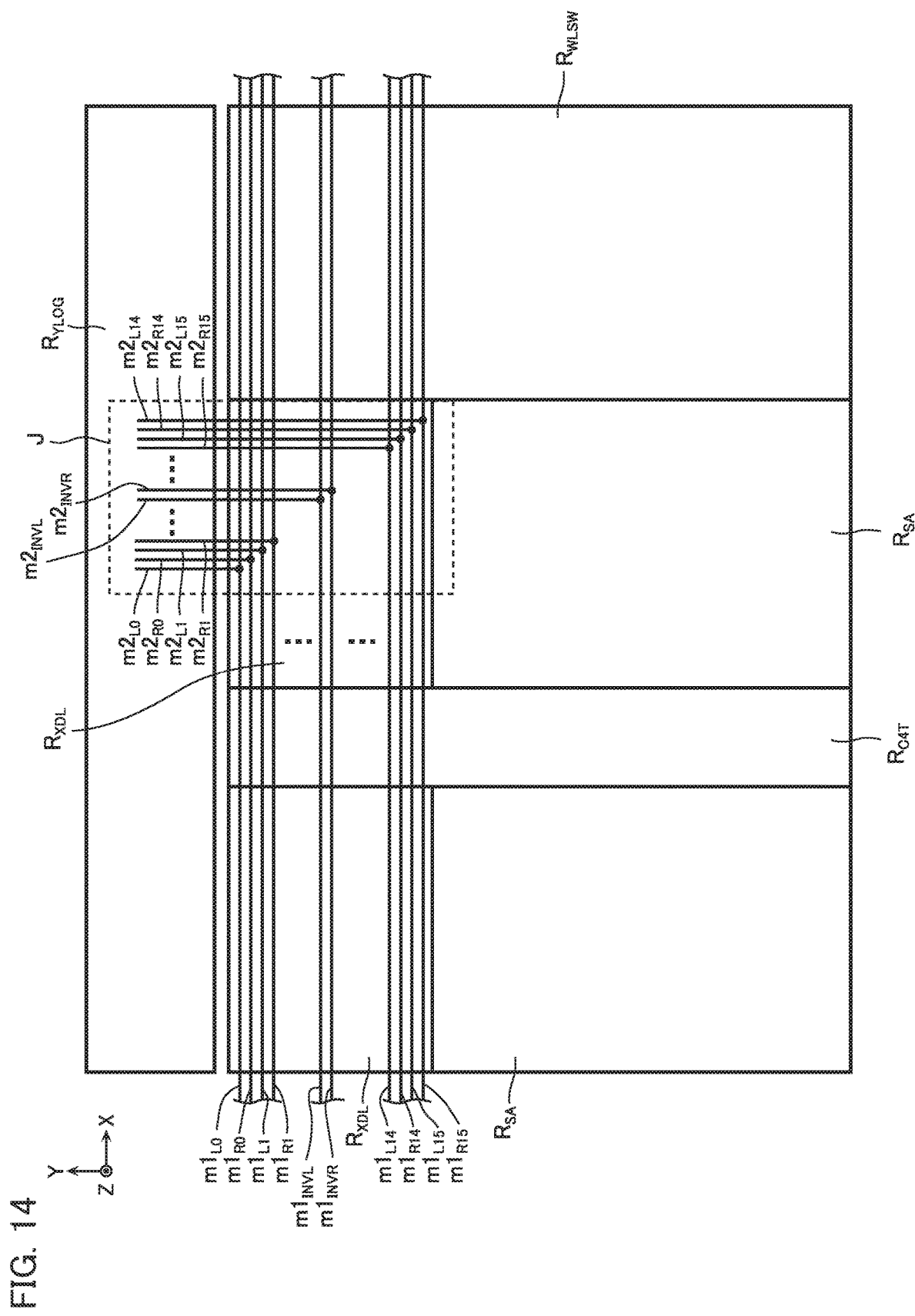
FIG. 14 is a schematic diagram illustrating control signal transmission wirings $m1_{L0}$ to $m1_{L15}$, $m1_{R0}$ to $m1_{R15}$ and inversion control signal transmission wirings $m1_{INVL}$, $m1_{INVR}$ overlapped on the drawing illustrated in FIG. 7.
Figure 15:
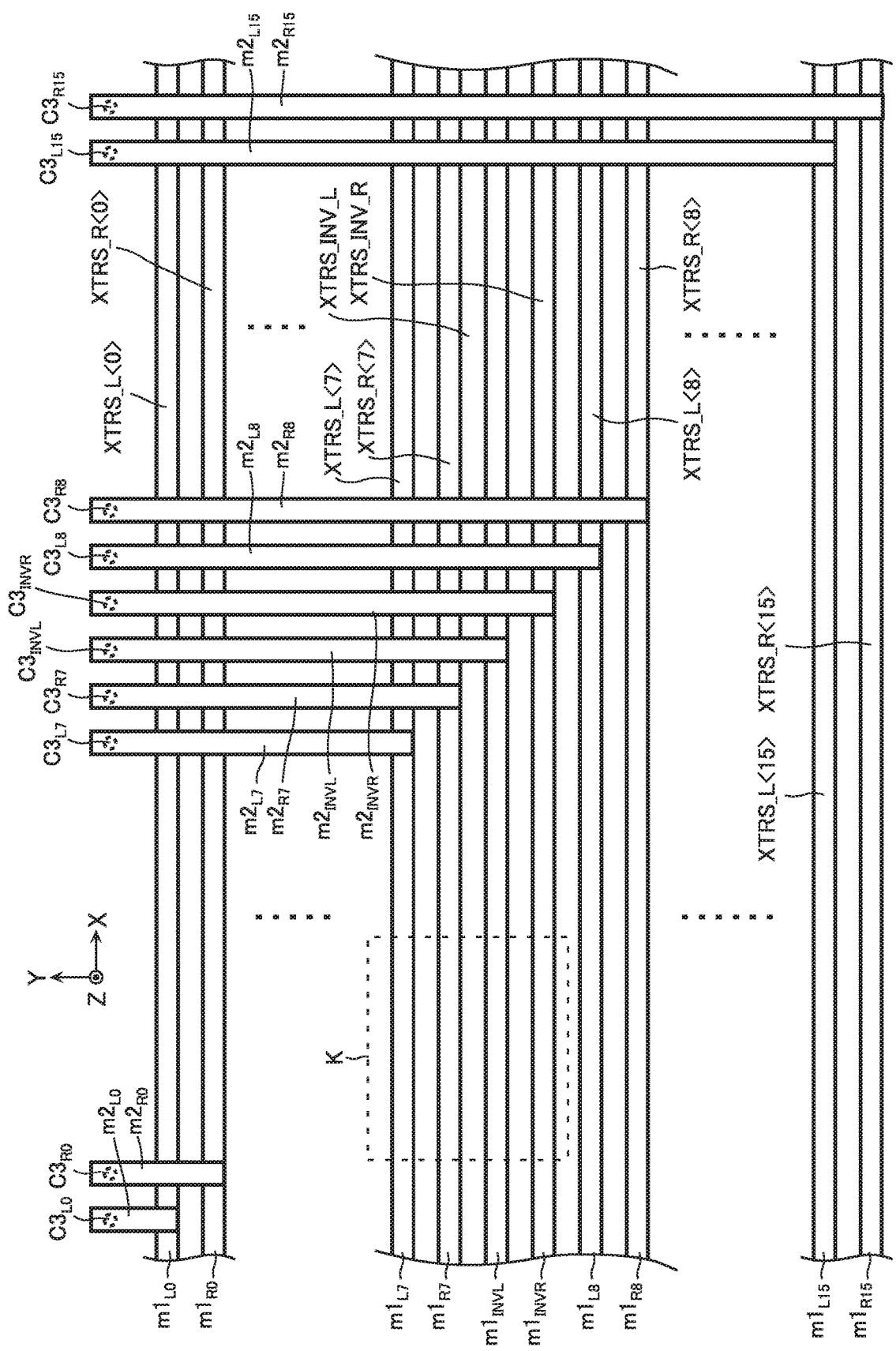
FIG. 15 is a schematic enlarged view of a part indicated by J in FIG. 14.
Figure 16:
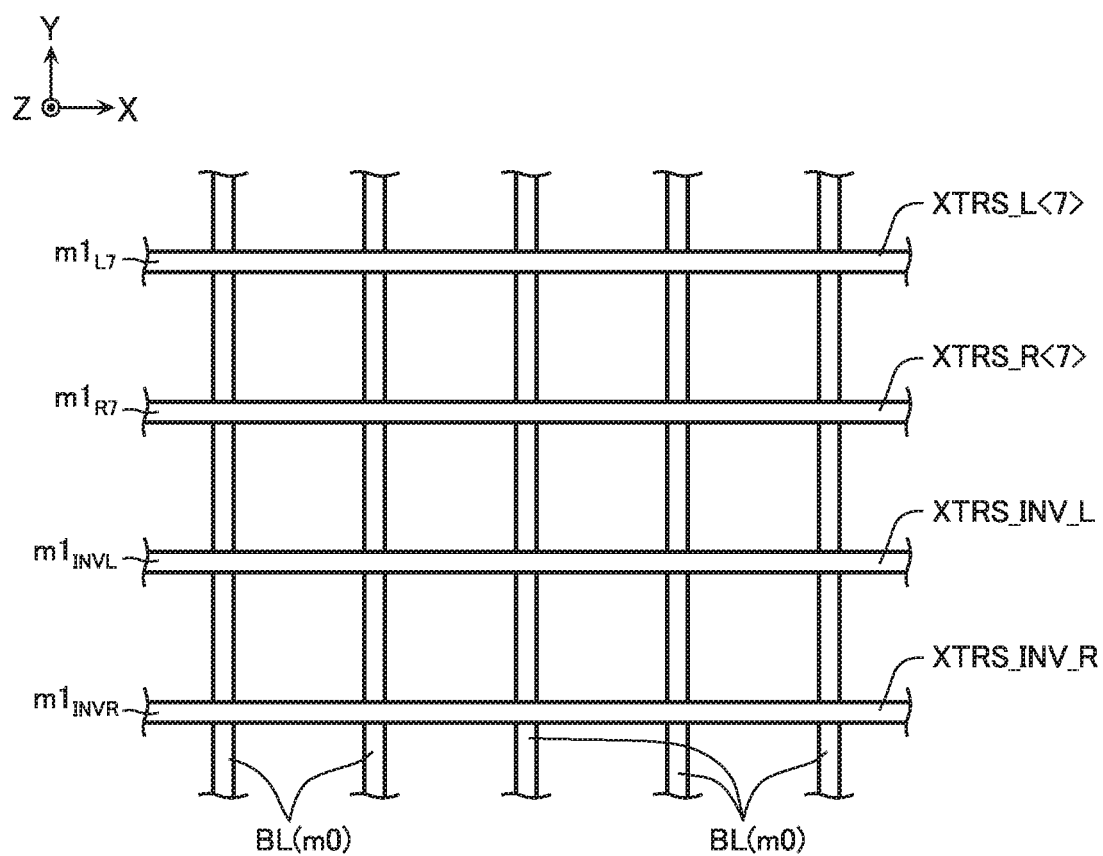
FIG. 16 is a schematic diagram illustrating a part indicated by K in FIG. 15 together with bit lines BL.

FIG. 5 is a schematic plan view of the memory die MD. FIG. 6 is a schematic cross-sectional view of the structure illustrated in FIG. 5 taken along a line A-A' and a line B-B' viewed along a direction of arrows. FIG. 6 is a drawing for describing a schematic configuration of the memory die MD, and does not illustrate the specific number, shape, arrangement, or the like of the configuration. FIG. 7 is a schematic enlarged view of a transistor layer $L_{TR}$ in a part indicated by C in FIG. 5. FIG. 8 is a schematic enlarged view of a part indicated by D in FIG. 5. FIG. 9 is a schematic cross-sectional view of the structure illustrated in FIG. 8 taken along a line E-E' viewed along a direction of arrows. FIG. 10 is a schematic enlarged view of a part indicated by F in FIG. 9. FIG. 11 is a schematic enlarged view of a part indicated by G in FIG. 5. FIG. 12 is a schematic cross-sectional view of the structure illustrated in FIG. 11 taken along a line H-H' viewed along a direction of arrows. FIG. 13 is a schematic cross-sectional view of the structure illustrated in FIG. 11 taken along a line I-I' viewed along a direction of arrows. FIG. 14 is a schematic diagram illustrating control signal transmission wirings $m1_{L0}$ to $m1_{L15}$, $m1_{R0}$ to $m1_{R15}$ and inversion control signal transmission wirings $m1_{INVL}$, $m1_{INVR}$ overlapped on the drawing illustrated in FIG. 7. FIG. 15 is a schematic enlarged view of a part indicated by J in FIG. 14. FIG. 16 is a schematic diagram illustrating a part indicated by K in FIG. 15 together with bit lines BL.

For example, as illustrated in FIG. 5, the memory die MD includes a semiconductor substrate 100. In the illustrated example, the semiconductor substrate 100 includes four memory cell array regions $R_{MCA}$ arranged in the X-direction and the Y-direction. The memory cell array region $R_{MCA}$ includes a plurality of memory hole regions $R_{MH}$ arranged in the X-direction and a plurality of contact connection regions $R_{C4T}$ disposed between these memory hole regions $R_{MH}$. In the center in the X-direction of the memory cell array region $R_{MCA}$, a hook-up region $R_{HU}$ is disposed. In one end portion in the Y-direction of the memory cell array region $R_{MCA}$, a plurality of contact connection regions $R_{BLT}$ arranged in the X-direction are disposed corresponding to the plurality of memory hole regions $R_{MH}$ arranged in the X-direction. In an end portion in the Y-direction of the semiconductor substrate 100, a peripheral region $R_P$ is disposed. The peripheral region $R_P$ extends in the X-direction along the end portion in the Y-direction of the semiconductor substrate 100.

For example, as illustrated in FIG. 6, the memory die MD includes the semiconductor substrate 100, the transistor layer $L_{TR}$ disposed on the semiconductor substrate 100, a wiring layer D0 disposed on the transistor layer $L_{TR}$, a wiring layer D1 disposed above the wiring layer D0, a wiring layer D2 disposed above the wiring layer D1, a memory cell array layer $L_{MCA}$ disposed above the wiring layer D2, a wiring layer M0 disposed above the memory cell array layer $L_{MCA}$, a wiring layer M1 disposed above the wiring layer M0, and a wiring layer M2 disposed above the wiring layer M1.

[Structure of Semiconductor Substrate 100]

For example, the semiconductor substrate 100 is a semiconductor substrate made of P-type silicon (Si) containing P-type impurities, such as boron (B). For example, as illustrated in FIG. 6, on a surface of the semiconductor substrate 100, an N-type well region 100N containing N-type impurities, such as phosphorus (P), a P-type well region 100P containing P-type impurities, such as boron (B), a semiconductor substrate region 100S in which the N-type well region 100N or the P-type well region 100P are not disposed, and an insulating region 100I are disposed. The N-type well region 100N, the P-type well region 100P, and the semiconductor substrate region 100S each function as a part of a plurality of transistors Tr, a plurality of capacitors, and the like constituting the peripheral circuit PC.

[Structure of Transistor Layer $L_{TR}$]

For example, as illustrated in FIG. 6, a wiring layer GC is disposed above an upper surface of the semiconductor substrate 100 via an insulating layer (not illustrated). The wiring layer GC includes a plurality of electrodes gc opposed to the surface of the semiconductor substrate 100. The regions of the semiconductor substrate 100 and the plurality of electrodes gc included in the wiring layer GC are each connected to a contact CS.

The plurality of respective electrodes gc included in the wiring layer GC function as the gate electrodes of the plurality of transistors Tr, the other electrodes of the plurality of capacitors, and the like constituting the peripheral circuit PC.

The contact CS extends in the Z-direction and is in contact with the semiconductor substrate 100 or the upper surface of the electrode gc at a lower end. In a connection part between the contact CS and the semiconductor substrate 100, an impurity region containing N-type impurities or P-type impurities is disposed. For example, the contact CS may include a stacked film of a barrier conductive film, such as titanium nitride (TiN), and a metal film, such as tungsten (W), or the like.

Note that, as illustrated in FIG. 7, in the memory hole region $R_{MH}$ of the transistor layer $L_{TR}$ (FIG. 6), a sense amplifier region $R_{SA}$ and a latch circuit region $R_{XDL}$ are disposed. In the hook-up region $R_{HU}$ of the transistor layer $L_{TR}$ (FIG. 6), a word line switch region $R_{WLSW}$ is disposed. In a region displaced in the Y-direction with respect to the memory cell array region $R_{MCA}$ of the transistor layer $L_{TR}$ (FIG. 6), a data control region $R_{YLOG}$ is disposed.

In the sense amplifier region $R_{SA}$, the sense amplifier module SAM (FIG. 3) and the like are disposed. In the latch circuit region $R_{XDL}$, the latch circuits XDL0 to XDL15 of the cache memory CM (FIG. 3) and the like are disposed. In the word line switch region $R_{WLSW}$, the switch circuit of the row decoder RD (FIG. 1) and the like are disposed.

In the data control region $R_{YLOG}$, the data cache control circuit 90 (FIG. 3) and the data cache inversion control circuit 91 (FIG. 3) are disposed. In the data control region $R_{YLOG}$, a control circuit (not illustrated) for controlling the sense amplifier module SAM (FIG. 1, FIG. 3) and the cache memory CM (FIG. 1, FIG. 3) is disposed.

[Structures of Wiring Layers D0, D1, and D2]

For example, as illustrated in FIG. 6, the plurality of wirings included in the wiring layers D0, D1, D2 are electrically connected to at least one of the configuration in the memory cell array MCA and the configuration in the peripheral circuit PC.

The wiring layers D0, D1, D2 include a plurality of wirings d0, d1, d2, respectively. For example, the plurality of wirings d0, d1, d2 may include a stacked film of a barrier conductive film, such as titanium nitride (TiN), and a metal film, such as tungsten (W).

[Structure of Memory Cell Array Layer $L_{MCA}$ in Memory Hole Region $R_{MH}$]

For example, as illustrated in FIG. 8, the memory cell array layer $L_{MCA}$ includes a plurality of memory blocks BLK arranged in the Y-direction. The memory block BLK includes a plurality of string units SU arranged in the Y-direction. For example, as illustrated in FIG. 9, an inter-block insulating layer ST of silicon oxide ($SiO_2$) or the like is disposed between the two memory blocks BLK mutually adjacent in the Y-direction.

For example, as illustrated in FIG. 9, the memory block BLK includes a plurality of conductive layers 110 arranged in the Z-direction, a plurality of semiconductor columns 120 extending in the Z-direction, and a plurality of respective gate insulating films 130 disposed between the plurality of conductive layers 110 and the plurality of semiconductor columns 120.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the respective adjacent conductive layers 110 arranged in the Z-direction, insulating layers 101, such as silicon oxide ($SiO_2$), are disposed.

A conductive layer 111 is disposed below the conductive layer 110. For example, the conductive layer 111 may contain polycrystalline silicon containing impurities, such as phosphorus (P) or boron (B). Between the conductive layer 111 and the conductive layer 110, an insulating layer 101 of silicon oxide (SiO$_2$) or the like is disposed.

A conductive layer 112 is disposed below the conductive layer 111. The conductive layer 112 includes a semiconductor layer 113 connected to the lower end of the semiconductor column 120, and a conductive layer 114 in contact with the lower surface of the semiconductor layer 113. The semiconductor layer 113 may contain, for example, a polycrystalline silicon containing N-type impurities, such as phosphorus (P), or P-type impurities, such as boron (B). The conductive layer 114 may include, for example, a conductive layer of a metal, such as tungsten (W), tungsten silicide, or the like or another conductive layer. Between the conductive layer 112 and the conductive layer 111, an insulating layer 101 of silicon oxide (SiO$_2$) or the like is disposed.

The conductive layer 112 functions as the source line SL (FIG. 2). The source line SL is, for example, disposed in common between all of the memory blocks BLK (FIG. 2, FIG. 8) included in the memory cell array region R$_{MCA}$ (FIG. 5).

The conductive layer 111 functions as the source-side select gate line SGSb (FIG. 2) and the gate electrodes of the plurality of source-side select transistors STSb connected thereto. The conductive layer 111 is electrically independent for each memory block BLK (FIG. 2, FIG. 8).

Among the plurality of conductive layers 110, one or the plurality of conductive layers 110 positioned at the lowermost layer function as the source-side select gate line SGS (FIG. 2) and the gate electrodes of the plurality of source-side select transistors STS connected thereto. These plurality of conductive layers 110 are electrically independent for each memory block BLK (FIG. 2, FIG. 8).

The plurality of conductive layers 110 positioned above these conductive layers 110 function as the word lines WL (FIG. 2) and the gate electrodes of the plurality of memory cells MC (FIG. 2) connected thereto. These plurality of conductive layers 110 are each electrically independent for each memory block BLK (FIG. 2, FIG. 8).

One or the plurality of conductive layers 110 positioned above these conductive layers 110 function as the drain-side select gate line SGD and gate electrodes of the plurality of drain-side select transistors STD (FIG. 2) connected thereto. These plurality of conductive layers 110 have widths in the Y-direction smaller than those of the other conductive layers 110. Between the two conductive layers 110 adjacent in the Y-direction, an inter-string unit insulating layer SHE is disposed. These plurality of conductive layers 110 are each electrically independent for each string unit SU (FIG. 2, FIG. 8, FIG. 13).

The semiconductor columns 120 are arranged in a predetermined pattern in the X-direction and the Y-direction. The semiconductor columns 120 function as channel regions of the plurality of memory cells MC and the select transistors (STD, STS, STSb) included in one memory string MS (FIG. 2). The semiconductor column 120 is, for example, a semiconductor column of polycrystalline silicon (Si) or the like. The semiconductor column 120 has, for example, as illustrated in FIG. 9, a substantially closed-bottomed cylindrical shape and includes an insulating layer 125 of silicon oxide or the like at its center part. Each of the outer peripheral surfaces of the semiconductor columns 120 is surrounded by the conductive layers 110 and is opposed to the conductive layers 110.

An impurity region 121 containing N-type impurities, such as phosphorus (P), is disposed on the upper end portion of the semiconductor column 120. In the example of FIG. 9, a boundary line between the upper end portion of the semiconductor column 120 and the lower end portion of the impurity region 121 is indicated by a dashed line. The impurity region 121 is connected to the bit line BL via a contact Ch and a contact Vy (FIG. 6).

An impurity region 122 containing N-type impurities, such as phosphorus (P), is disposed on the lower end portion of the semiconductor column 120. In the example of FIG. 9, a boundary line between the lower end portion of the semiconductor column 120 and the upper end portion of the impurity region 122 is indicated by a dashed line. The impurity region 122 is connected to the semiconductor layer 113 of the conductive layer 112. In the semiconductor column 120, a portion positioned immediately above the impurity region 122 functions as a channel region of the source-side select transistor STSb. The outer peripheral surface of the impurity region 122 is surrounded by the conductive layer 111, and opposed to the conductive layer 111.

The gate insulating film 130 has a substantially closed-bottomed cylindrical shape that covers the outer peripheral surface of the semiconductor column 120. The gate insulating film 130 includes, for example, as illustrated in FIG. 10, a tunnel insulating film 131, an electric charge accumulating film 132, and a block insulating film 133, which are stacked between the semiconductor column 120 and the conductive layers 110. The tunnel insulating film 131 and the block insulating film 133 are, for example, insulating films of silicon oxide (SiO$_2$) or the like. The electric charge accumulating film 132 is, for example, a film of silicon nitride (Si$_3$N$_4$) or the like, that can accumulate an electric charge. The tunnel insulating film 131, the electric charge accumulating film 132, and the block insulating film 133, which have substantially cylindrical shapes, extend in the Z-direction along the outer peripheral surface of the semiconductor column 120 excluding the contact portion of the semiconductor column 120 and the semiconductor layer 113.

FIG. 10 illustrates an example in which the gate insulating film 130 includes the electric charge accumulating film 132 of silicon nitride or the like. However, the gate insulating film 130 may include, for example, a floating gate of polycrystalline silicon containing N-type or P-type impurities or the like.

[Structure of Memory Cell Array Layer L$_{MCA}$ in Contact Connection Region R$_{C4T}$]

For example, as illustrated in FIG. 12, the contact connection region R$_{C4T}$ includes two insulating layers ST$_O$ arranged in the Y-direction between the two inter-block insulating layers ST arranged in the Y-direction. Between these two insulating layers ST$_O$, a contact connection sub-region r$_{C4T}$ is disposed. Between the inter-block insulating layer ST and the insulating layer ST$_O$, a conductive layer connection sub-region r$_{110}$ is disposed. These regions extend in the X-direction along the inter-block insulating layer ST.

For example, as illustrated in FIG. 12, the insulating layer ST$_O$ extends in the Z-direction, and is in contact with the conductive layer 112 at the lower end. The insulating layer ST$_O$ contains silicon oxide (SiO$_2$) or the like.

The contact connection sub-region r$_{C4T}$ includes a plurality of insulating layers 110A arranged in the Z-direction and a plurality of contacts C4 extending in the Z-direction.

The insulating layer 110A is an approximately plate-shaped insulating layer extending in the X-direction. The insulating layer 110A may include an insulating layer of silicon nitride (SiN) or the like. Between the respective adjacent insulating layers 110A arranged in the Z-direction, insulating layers 101 of silicon oxide (SiO$_2$) or the like are disposed.

For example, as illustrated in FIG. 11, a plurality of the contacts C4 are arranged in the X-direction. The contact C4 may include, for example, a stacked film of a barrier conductive film, such as titanium nitride (TiN), and a metal film, such as tungsten (W). For example, as illustrated in FIG. 12, the outer peripheral surfaces of the contacts C4 are each surrounded by the insulating layers 110A and the insulating layers 101, and in contact with these insulating layers 110A and insulating layers 101. Note that, for example, as illustrated in FIG. 6, the contact C4 extends in the Z-direction, is connected to a wiring m0 in the wiring layer M0 at the upper end, and is connected to a wiring d2 in the wiring layer D2 at the lower end.

For example, as illustrated in FIG. 12, the conductive layer connection sub-region $r_{110}$ includes narrow-width portions $110_{C4T}$ of the plurality of conductive layers 110 arranged in the Z-direction. For example, as illustrated in FIG. 11, the plurality of conductive layers 110 included in the two memory hole regions $R_{MH}$ adjacent in the X-direction are electrically conducted one another via the narrow-width portions $110_{C4T}$.

[Structure of Memory Cell Array Layer $L_{MCA}$ in Hook-Up Region $R_{HU}$]

The hook-up region $R_{HU}$ (FIG. 5, FIG. 8) includes a part of the plurality of conductive layers 110. The hook-up region $R_{HU}$ includes a plurality of contacts CC. The plurality of contacts CC extend in the Z-direction, and are in contact with the conductive layer 110 at the lower ends. The contact CC may include, for example, a stacked film of a barrier conductive film of titanium nitride (TiN) or the like and a metal film of tungsten (W) or the like. The plurality of contacts CC are connected to the drain electrodes of the transistors Tr via the wirings m0, m1, m2 in the wiring layers M0, M1, M2, the contacts C4, the wirings d0, d1, d2 in the wiring layers D0, D1, D2, and the contacts CS.

[Structure of Memory Cell Array Layer $L_{MCA}$ in Contact Connection Region $R_{BLT}$]

For example, as illustrated in FIG. 13, the contact connection region $R_{BLT}$ includes a plurality of insulating layers 110A arranged in the Z-direction, and a contact $C4_{BL}$ extending in the Z-direction.

For example, as illustrated in FIG. 11, a plurality of the contacts $C4_{BL}$ are arranged in the X-direction and the Y-direction. The contact $C4_{BL}$ may include, for example, a stacked film of a barrier conductive film of titanium nitride (TiN) or the like and a metal film of tungsten (W) or the like. For example, as illustrated in FIG. 13, the outer peripheral surfaces of the contacts $C4_{BL}$ are each surrounded by the insulating layers 110A and the insulating layers 101, and in contact with these insulating layers 110A and insulating layers 101. For example, as illustrated in FIG. 13, the contact $C4_{BL}$ extends in the Z-direction, and is connected to the bit line BL at the upper end. Although the illustration is omitted, the contact $C4_{BL}$ is connected to the wiring d2 (FIG. 6) in the wiring layer D2 at the lower end.

[Configuration of Region Displaced in Y-Direction with Respect to Memory Cell Array Region $R_{MCA}$]

As illustrated in FIG. 6, in a region displaced in the Y-direction with respect to the memory cell array region $R_{MCA}$ (region corresponding to the line B-B' of FIG. 5), a contact C3 extending in the Z-direction is disposed. The contact C3 may include, for example, a stacked film of a barrier conductive film of titanium nitride (TiN) or the like and a metal film of tungsten (W) or the like. The outer peripheral surface of the contact C3 is surrounded by not the conductive layers 110 or the insulating layers 101 but an insulating layer 102 of silicon oxide ($SiO_2$) or the like, different from the contact C4 (FIG. 6) and the contact $C4_{BL}$ (FIG. 13). Note that, for example, as illustrated in FIG. 6, the contact C3 extends in the Z-direction, is connected to the wiring m0 in the wiring layer M0 at the upper end, and is connected to the wiring d2 in the wiring layer D2 at the lower end.

[Structures of Wiring Layers M0, M1, and M2]

For example, as illustrated in FIG. 6, a plurality of wirings included in the wiring layers M0, M1, M2 are, for example, electrically connected to at least one of the configuration in the memory cell array layer $L_{MCA}$ and the configuration in the transistor layer $L_{TR}$.

The wiring layers M0 each include a plurality of the wirings m0. Each of the plurality of wirings m0 may include, for example, a stacked film of a barrier conductive film of titanium nitride (TiN) or the like and a metal film of copper (Cu) or the like.

The wiring layers M1 each include a plurality of the wirings m1. Each of the plurality of wirings m1 may include, for example, a stacked film of a barrier conductive film of titanium nitride (TiN) or the like and a metal film of copper (Cu) or the like.

The wiring layers M2 each include a plurality of the wirings m2. Each of the plurality of wirings m2 may include, for example, a stacked film of a barrier conductive film of titanium nitride (TiN) or the like and a metal film of aluminum (Al) or the like.

Among the plurality of wirings m0, those disposed above the memory hole region $R_{MH}$ function as the bit lines BL (FIG. 2, FIG. 6, FIG. 13). The bit lines BL are arranged in the X-direction as illustrated in FIG. 6, and extend in the Y-direction as illustrated in FIG. 13. The plurality of bit lines BL are each connected to one semiconductor column 120 included in each string unit SU (FIG. 2, FIG. 13). For example, as illustrated in FIG. 13, the plurality of bit lines BL are each connected to the contact $C4_{BL}$.

As illustrated in FIG. 14 and FIG. 15, among the plurality of wirings m1, a part of those disposed above the latch circuit region $R_{XDL}$ function as 32 control signal transmission wirings $m1_{L0}$ to $m1_{L15}$, $m1_{R0}$ to $m1_{R15}$. The control signal transmission wirings $m1_{L0}$ to $m1_{L15}$, $m1_{R0}$ to $m1_{R15}$ extend in the X-direction, and are arranged in the Y-direction at predetermined intervals.

As illustrated in FIG. 14 and FIG. 15, among the plurality of wirings m1, a part of those disposed above the latch circuit region $R_{XDL}$ function as two inversion control signal transmission wirings $m1_{INVL}$, $m1_{INVR}$. The inversion control signal transmission wirings $m1_{INVR}$ are disposed at a position between the control signal transmission wiring $m1_{R7}$ and the control signal transmission wiring $m1_{L8}$, extend in the X-direction, and are arranged in the Y-direction at a predetermined interval. That is, regarding the Y-direction, the two inversion control signal transmission wirings $m1_{INVL}$, $m1_{INVR}$ are disposed at the center position of the 32 control signal transmission wirings $m1_{L0}$ to $m1_{L15}$, $m1_{R0}$ to $m1_{R15}$.

The control signal transmission wiring $m1_{L0}$ is electrically connected to the data cache control circuit 90 (FIG. 7) via the wiring $m2_{L0}$ of the wiring layer M2, the contact $C3_{L0}$ (FIG. 15), and the like. The control signal transmission wiring $m1_{L0}$ is electrically connected to the conversion circuit 80 (FIG. 3) via the contact C4 (FIG. 6) and the wirings d2, d1, d0 of the wiring layers D2, D1, D0, and the like.

The control signal transmission wiring $m1_{R0}$ is electrically connected to the data cache control circuit 90 (FIG. 7) via the wiring $m2_{R0}$ of the wiring layer M2, the contact $C3_{R0}$ (FIG. 15), and the like. The control signal transmission wiring $m1_{R0}$ is electrically connected to the conversion circuit 80 (FIG. 3) via the contact C4 (FIG. 6) and the wirings d2, d1, d0 of the wiring layers D2, D1, D0, and the like.

Similarly, the control signal transmission wirings $m1_{L1}$ to $m1_{L15}$, $m1_{R1}$ to $m1_{R15}$ are electrically connected to the data cache control circuit 90 (FIG. 7) via the wirings $m2_{L1}$ to $m2_{L15}$, $m2_{R1}$ to $m2_{R15}$ of the wiring layer M2, the contacts $C3_{L1}$ to $C3_{L15}$, $C3_{R1}$ to $C3_{R15}$ (FIG. 15), and the like. The control signal transmission wirings $m1_{L1}$ to $m1_{L15}$, $m1_{R1}$ to $m1_{R15}$ are electrically connected to the conversion circuit 80 (FIG. 3) via the contact C4 (FIG. 6) and the wirings d2, d1, d0 of the wiring layers D2, D1, D0, and the like.

The inversion control signal transmission wiring $m1_{INVL}$ is electrically connected to the data cache inversion control circuit 91 (FIG. 7) via a wiring $m2_{INVL}$ of the wiring layer M2, a contact $C3_{INVL}$ (FIG. 15), and the like. The inversion control signal transmission wiring $m1_{INVR}$ is electrically connected to the data cache inversion control circuit 91 (FIG. 7) via a wiring $m2_{INVR}$ of the wiring layer M2, a contact $C3_{INVR}$ (FIG. 15), and the like.

As described above, the control signal transmission wirings $m1_{L0}$ to $m1_{L15}$, $m1_{R0}$ to $m1_{R15}$ and the inversion control signal transmission wirings $m1_{INVL}$, $m1_{INVR}$ (FIG. 14, FIG. 15) extend in the X-direction. Meanwhile, the bit lines BL (FIG. 6, FIG. 13) extend in the Y-direction. Therefore, while the control signal transmission wirings $m1_{L0}$ to $m1_{L15}$, $m1_{R0}$ to $m1_{R15}$ and the inversion control signal transmission wirings $m1_{INVL}$, $m1_{INVR}$ are different from the bit lines BL in position in the Z-direction, they intersect (overlap) when an X-Y plane is viewed along the Z-direction as illustrated in FIG. 16. Consequently, a capacitive coupling possibly occurs between the control signal transmission wirings $m1_{L0}$ to $m1_{L15}$, $m1_{R0}$ to $m1_{R15}$ and the inversion control signal transmission wirings $m1_{INVL}$, $m1_{INVR}$, and the bit lines BL intersecting (overlapping) with these wirings while being close thereto.

[Description of Read Operation]

Figure 17:
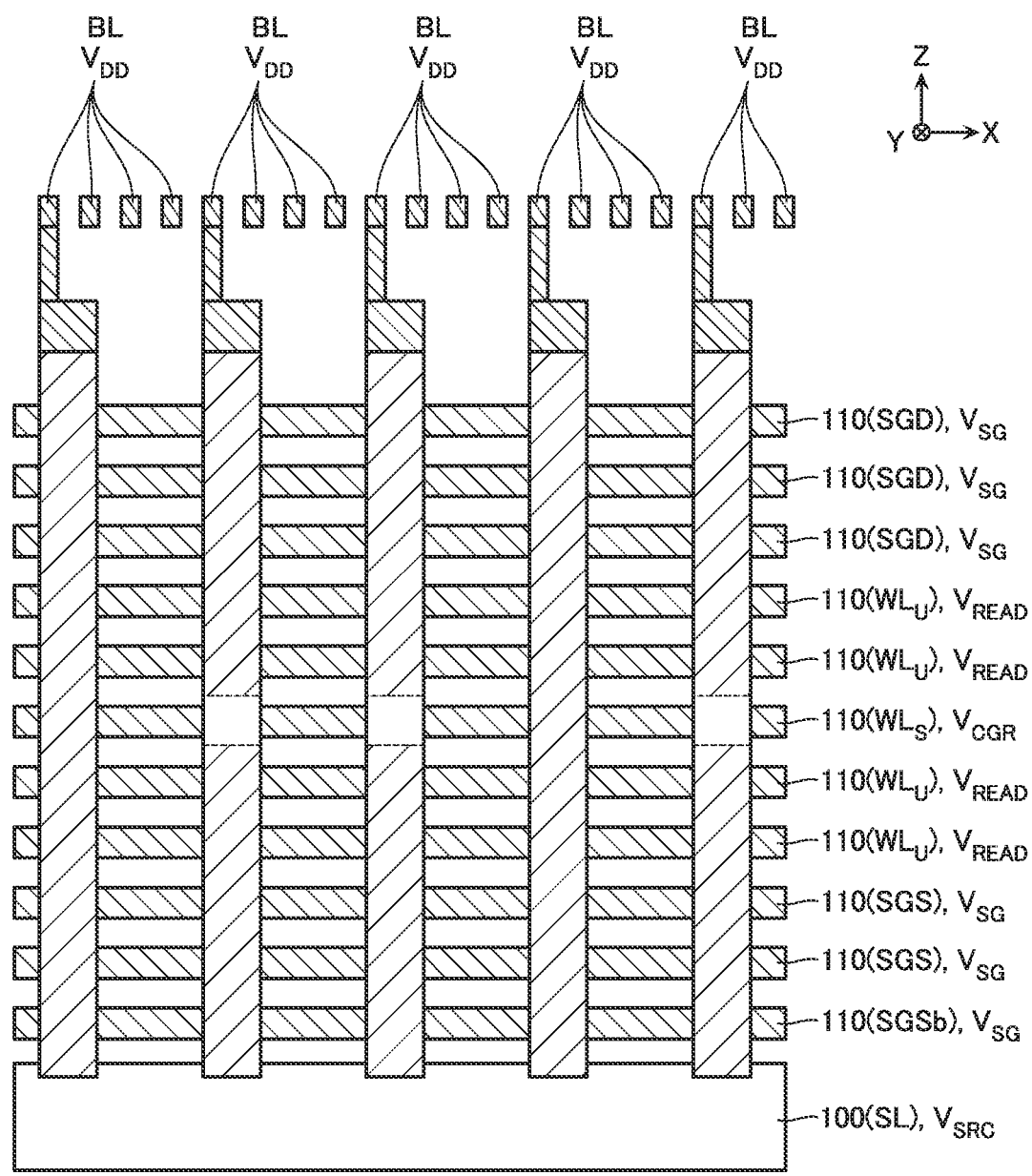
FIG. 17 is a schematic cross-sectional view for describing a read operation.
Figure 18:
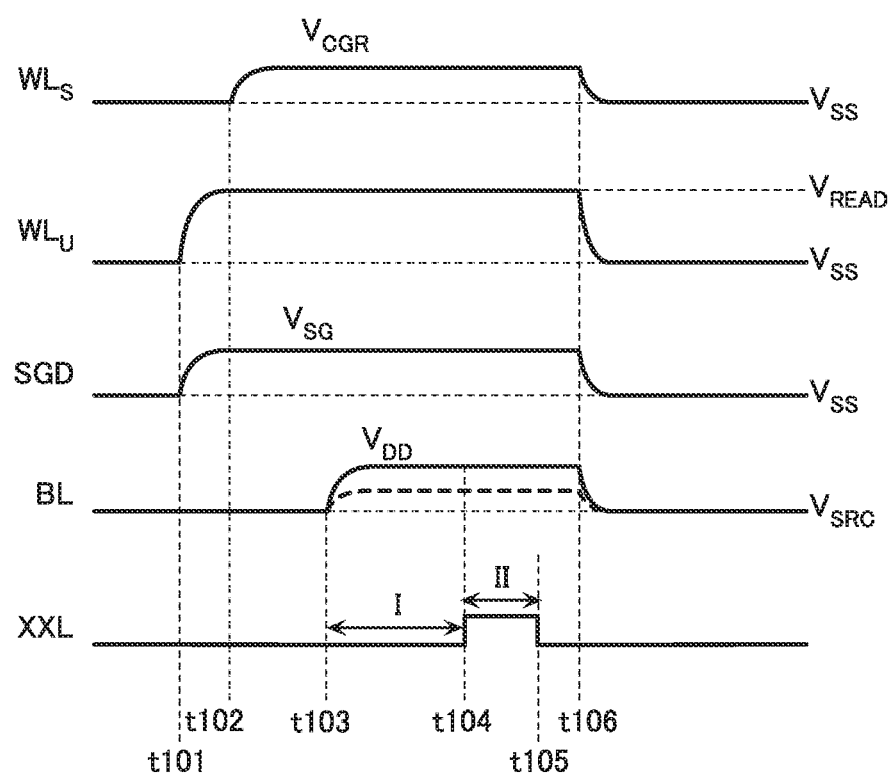
FIG. 18 is a schematic waveform diagram for describing the read operation.

FIG. 17 is a schematic cross-sectional view for describing a read operation. FIG. 18 is a schematic waveform diagram for describing the read operation. Note that, in the following description, the word line WL as an object of operation may be referred to as a selected word line $WL_S$ and the other word line WL may be referred to as an unselected word line $WL_U$. Also, the following description will describe an example where the read operation is executed on the memory cell MC connected to the selected word line $WL_S$ (hereinafter may be referred to as a "selected memory cell MC") among the plurality of memory cells MC included in the string unit SU as an object of operation.

At timing t101 of the read operation, a read pass voltage VREAD is supplied to the unselected word line $WL_U$ to turn all of the memory cells MC ON. A voltage $V_{SG}$ is supplied to the select gate lines (SGD, SGS, SGSb). The voltage $V_{SG}$ has a magnitude that electron channels are formed in the channel regions of the select transistors (STD, STS, STSb), thereby turning the select transistors (STD, STS, STSb) ON.

At timing t102 of the read operation, a predetermined read voltage $V_{CGR}$ is supplied to the selected word line $WL_S$. Accordingly, a part of the selected memory cells MC are turned ON, and the other selected memory cells MC are turned OFF.

At timing t103 of the read operation, a voltage $V_{DD}$ is supplied to the bit lines BL. For example, in the sense amplifier SA illustrated in FIG. 4, the transistors 44, 45, 46, 47, and 49 are turned ON while turning the transistors 42, 43 OFF. Accordingly, the voltage $V_{DD}$ is supplied to the bit lines BL and the sense node SEN, thus starting charging of these. For example, the voltage $V_{SRC}$ is supplied to the source line SL, thus starting charging of these. The voltage $V_{SRC}$ has a magnitude, for example, similar to that of the ground voltage $V_{SS}$. The voltage $V_{SRC}$ may be a voltage, for example, larger than the ground voltage $V_{SS}$ and smaller than the voltage $V_{DD}$.

At timing t104 of the read operation, a sense operation is started. In the sense operation, for example, the sense amplifier module SAM (FIG. 3) detects an ON state/OFF state of the memory cell MC, thus obtaining data indicating the state of this memory cell MC. For example, in the sense amplifier SA (FIG. 4), the transistors 43, 44, 45 are turned ON and the transistors 42, 46, 49 are turned OFF, thus making the sense node SEN of the sense amplifier SA electrically conducted with the bit line BL.

Here, for example, when the memory cell MC is in the ON state, as indicated by the dashed line in FIG. 18, the voltage of the bit line BL and the sense node SEN becomes relatively low. Accordingly, the sense transistor 41 is turned OFF. Meanwhile, for example, when the memory cell MC is in the OFF state, as indicated by the solid line in the drawing, the voltage of the bit line BL and the sense node SEN becomes relatively high. Accordingly, the sense transistor 41 is turned ON.

At timing t105 of the read operation, the sense operation is ended. For example, in the sense amplifier SA (FIG. 4), the transistors 44, 45 are turned ON and the transistors 42, 43, 46, 49 are turned OFF, thus electrically separating the sense node SEN of the sense amplifier SA from the bit line BL.

At timing t106 of the read operation, the ground voltage $V_{SS}$ is supplied to the selected word line $WL_S$, the unselected word line $WL_U$, and the select gate line (SGD, SGS, SGSb). The voltage $V_{SRC}$ is supplied to the bit line BL.

After the execution of the sense operation, the switch transistor 42 (FIG. 4) is turned ON to make the sense transistor 41 electrically conducted with the wiring LBUS (FIG. 3, FIG. 4). As described above, the sense transistor 41 is turned OFF or ON in accordance with the ON state/OFF state of the memory cell MC. Accordingly, an electric charge of the wiring LBUS is discharged or kept in accordance with the ON state/OFF state of the memory cell MC. In addition, any of the latch circuits SDL, DL0 to DLn in the sense amplifier unit SAU (FIG. 3, FIG. 4) is electrically conducted with the wiring LBUS, and this latch circuit SDL, DL0 to DLn latches data of the wiring LBUS.

In the read operation, the read data may be the data indicating the state of the memory cell MC. In the read operation, the read data may be an operation result of executing an arithmetic operation, such as AND and OR, to the data indicating the state of the memory cell MC. The read data is transferred to the cache memory CM (FIG. 1, FIG. 3) via the wiring LBUS, the switch transistor DSW, and the wiring DBUS illustrated in FIG. 3 and FIG. 4.

In the following description, a period from timing t103 to timing t104 in FIG. 18 is referred to as a "charge period I" in some cases. A period from timing t104 to timing t105 is referred to as a "sense operation period II" in some cases.

[Description of Data Transfer Operation]

When the read data obtained by the read operation is output from the memory die MD, a data transfer operation is executed. The data transfer operation is an operation that, for example, transfers the data DAT, such as read data latched by the cache memory CM (FIG. 1), to the input/output control circuit I/O (FIG. 1) and transfers the data DAT, such as write data input from the input/output control circuit I/O (FIG. 1), to the cache memory CM (FIG. 1).

Figure 19:
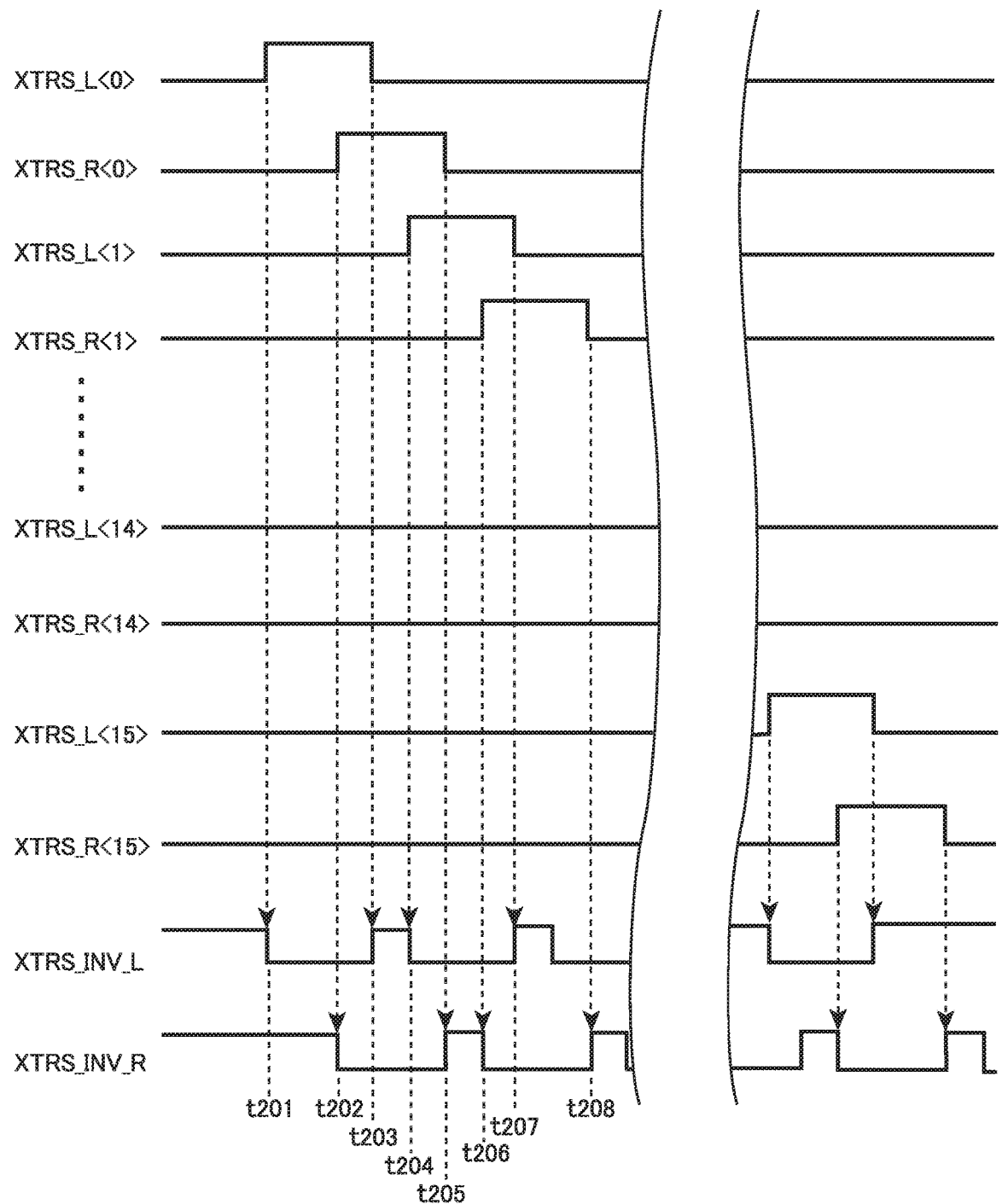
FIG. 19 is a schematic waveform diagram for describing a data transfer operation.

FIG. 19 is a schematic waveform diagram for describing the data transfer operation.

One page as the minimum unit of the read operation and the write operation is divided into 16, for example. Hereinafter, one division unit obtained by thus dividing a page into 16 is referred to as a "tier" in some cases. These 16 tiers are further divided into tiers L and tiers R. In the data transfer operation, these 16 tiers L and tiers R are sequentially selected, and the pieces of data corresponding to the selected tiers L, tiers R are sequentially transferred.

FIG. 19 illustrates data cache control signals XTRS_L<0> to XTRS_L<15>, XTRS_R<0> to XTRS_R<15> as the output signals of the data cache control circuit 90 (FIG. 3, FIG. 7). The data cache control signals XTRS_L<0> to XTRS_L<15> are signals corresponding to the first to 16th tiers L, respectively. The data cache control signals XTRS_R<0> to XTRS_R<15> are signals corresponding to the first to 16th tiers R, respectively.

The data cache control signals XTRS_L<0> to XTRS_L<15>, XTRS_R<0> to XTRS_R<15> output from the data cache control circuit 90 (FIG. 7) are transmitted to the conversion circuit 80 (FIG. 3) via the control signal transmission wirings $m1_{L0}$ to $m1_{L15}$, $m1_{R0}$ to $m1_{R15}$ described with reference to FIG. 14 and FIG. 15.

FIG. 19 illustrates data cache inversion control signals XTRS_INV_L, XTRS_INV_R as the output signals of the data cache inversion control circuit 91 (FIG. 3, FIG. 7). The data cache inversion control signal XTRS_INV_L is a signal, for example, obtained by performing the OR operation on all of the signals of the data cache control signals XTRS_L<0> to XTRS_L<15> and then inverting them. The data cache inversion control signal XTRS_INV_R is a signal, for example, obtained by performing the OR operation on all of the signals of the data cache control signals XTRS_R<0> to XTRS_R<15> and then inverting them.

The data cache inversion control signals XTRS_INV_L, XTRS_INV_R output from the data cache inversion control circuit 91 (FIG. 7) are transmitted to the inversion control signal transmission wirings $m1_{INVL}$, $m1_{INVR}$ described with reference to FIG. 14 and FIG. 15.

As illustrated in FIG. 19, at a timing immediately before the data transfer operation is started, the data cache control signals XTRS_L<0> to XTRS_L<15>, XTRS_R<0> to XTRS_R<15> are set to the low voltage states. The data cache inversion control signals XTRS_INV_L, XTRS_INV_R are set to the high voltage states.

At timing t201 of the data transfer operation, the data cache control signal XTRS_L<0> transitions to the high voltage state, and the data cache inversion control signal XTRS_INV_L transitions to the low voltage state.

In a period from timing t201 to timing t203 of the data transfer operation, the data corresponding to the first tier L is transferred.

For example, when the data of the first tier L is transferred to the input/output control circuit I/O (FIG. 1), the wirings XBUS0 to XBUS15 described with reference to FIG. 3 are charged. Next, the conversion circuit 80 puts the control signal XTL0 in the high voltage state and puts the control signals XTL1 to XTLn in the low voltage states. Accordingly, the data of the latch circuits XDL0 to XDL015 of the cache memory CM0 is transferred to the wirings XBUS0 to XBUS15. Next, the wirings XBUS0 to XBUS15 are electrically conducted with the bus DB (FIG. 1). Accordingly, the data of the wirings XBUS0 to XBUS15 is transferred to the input/output control circuit I/O (FIG. 1). Similarly, the wirings XBUS0 to XBUS15 are sequentially charged, the control signals XTL1 to XTL15 sequentially enter the high voltage state one by one, and the wirings XBUS0 to XBUS15 are sequentially electrically conducted with the bus DB (FIG. 1).

For example, when the data of the first tier L is obtained from the input/output control circuit I/O (FIG. 1), the wirings XBUS0 to XBUS15 are electrically conducted with the bus DB (FIG. 1). Accordingly, the data of the input/output control circuit I/O (FIG. 1) is transferred to the wirings XBUS0 to XBUS15. Next, the conversion circuit 80 puts the control signal XTL0 in the high voltage state, and puts the control signals XTL1 to XTL15 in the low voltage state. Accordingly, the data of the wirings XBUS0 to XBUS15 is transferred to the latch circuit XDL0. Similarly, the wirings XBUS0 to XBUS15 are sequentially electrically conducted with the bus DB (FIG. 1), and the control signals XTL1 to XTL15 sequentially enter the high voltage state one by one.

At timing t202 of the data transfer operation, the data cache control signal XTRS_R<0> transitions to the high voltage state, and the data cache inversion control signal XTRS_INV_R transitions to the low voltage state.

In a period from timing t202 to timing t205 of the data transfer operation, the data corresponding to the first tier R is transferred.

At timing t203 of the data transfer operation, the data cache control signal XTRS_L<0> transitions to the low voltage state, and the data cache inversion control signal XTRS_INV_L transitions to the high voltage state.

At timing t204 of the data transfer operation, the data cache control signal XTRS_L<1> transitions to the high voltage state, and the data cache inversion control signal XTRS_INV_L transitions to the low voltage state.

In a period from timing t204 to timing t207 of the data transfer operation, the data corresponding to the second tier L is transferred.

At timing t205 of the data transfer operation, the data cache control signal XTRS_R<0> transitions to the low voltage state, and the data cache inversion control signal XTRS_INV_R transitions to the high voltage state.

At timing t206 of the data transfer operation, the data cache control signal XTRS_R<1> transitions to the high voltage state, and the data cache inversion control signal XTRS_INV_R transitions to the low voltage state.

In a period from timing t206 to timing t208 of the data transfer operation, the data corresponding to the second tier R is transferred.

At timing t207 of the data transfer operation, the data cache control signal XTRS_L<1> transitions to the low voltage state, and the data cache inversion control signal XTRS_INV_L transitions to the high voltage state.

In the following, similarly, the data cache control signals XTRS_L<2> to XTRS_L<15> sequentially transitions to the high voltage state. At a timing when any of the data cache control signals XTRS_L<2> to XTRS_L<15> transitions to the high voltage state, the data cache inversion control signal XTRS_INV_L transitions to the low voltage state. At a timing when any of the data cache control signals XTRS_R<2> to XTRS_R<15> transitions to the low voltage state, the data cache inversion control signal XTRS_INV_L transitions to the high voltage state. The data corresponding to the third to 16th tiers L is transferred.

Similarly, the data cache control signals XTRS_R<2> to XTRS_R<15> sequentially transition to the high voltage state. At a timing when any of the data cache control signals XTRS_R<2> to XTRS_R<15> transitions to the high voltage state, the data cache inversion control signal XTRS_INV_R transitions to the low voltage state. At a timing when any of the data cache control signals XTRS_R<2> to XTRS_R<15> transitions to the low voltage state, the data cache inversion control signal XTRS_INV_R transitions to the high voltage state. The data corresponding to the third to 16th tiers R is transferred.

[Influence of Coupling Noise in Read Operation]

The read operation and the data transfer operation are executable at independent timings (ansynchronous timings). Here, as described above, a capacitive coupling possibly occurs between the control signal transmission wirings $m1_{L0}$ to $m1_{L15}$, $m1_{R0}$ to $m1_{R15}$ and the inversion control signal transmission wirings $m1_{INVL}$, $m1_{INVR}$, and the bit lines BL intersecting (overlapping) with these wirings while being close thereto (see FIG. 16). Accordingly, when the data transfer operation is executed during the read operation, the voltage of the bit line BL connected to the selected memory cell MC in the OFF state is decreased by the capacitive coupling, and the data of the selected memory cell MC is possibly determined to be in the ON state. The voltage of the bit line BL connected to the selected memory cell MC in the ON state is increased by the capacitive coupling, and the data of the selected memory cell MC is possibly determined to be in the OFF state.

[Noise Compensation in Read Operation]

As described above, the semiconductor memory device according to the embodiment includes the inversion control signal transmission wirings $m1_{INVL}$, $m1_{INVR}$. In the data transfer operation according to the embodiment, at the timing when the data cache control signals XTRS_L<0> to XTRS_L<15>, XTRS_R<0> to XTRS_R<15> transmitted via the control signal transmission wirings $m1_{L0}$ to $m1_{L15}$, $m1_{R0}$ to $m1_{R15}$ are inverted, the data cache inversion control signals XTRS_INV_L, XTRS_INV_R transmitted to the inversion control signal transmission wirings $m1_{INVL}$, $m1_{INVR}$ are inverted. With this method, the noise to the bit line BL caused by the capacitive coupling can be reduced.

The data cache inversion control signals XTRS_INV_L, XTRS_INV_R may be constantly generated when the data transfer operation is executed, or may be generated only when the data transfer operation is executed at a specific timing. For example, in at least one of the charge period I and the sense operation period II described with reference to FIG. 18, the data cache inversion control signals XTRS_INV_L, XTRS_INV_R may be generated.

Figure 20:
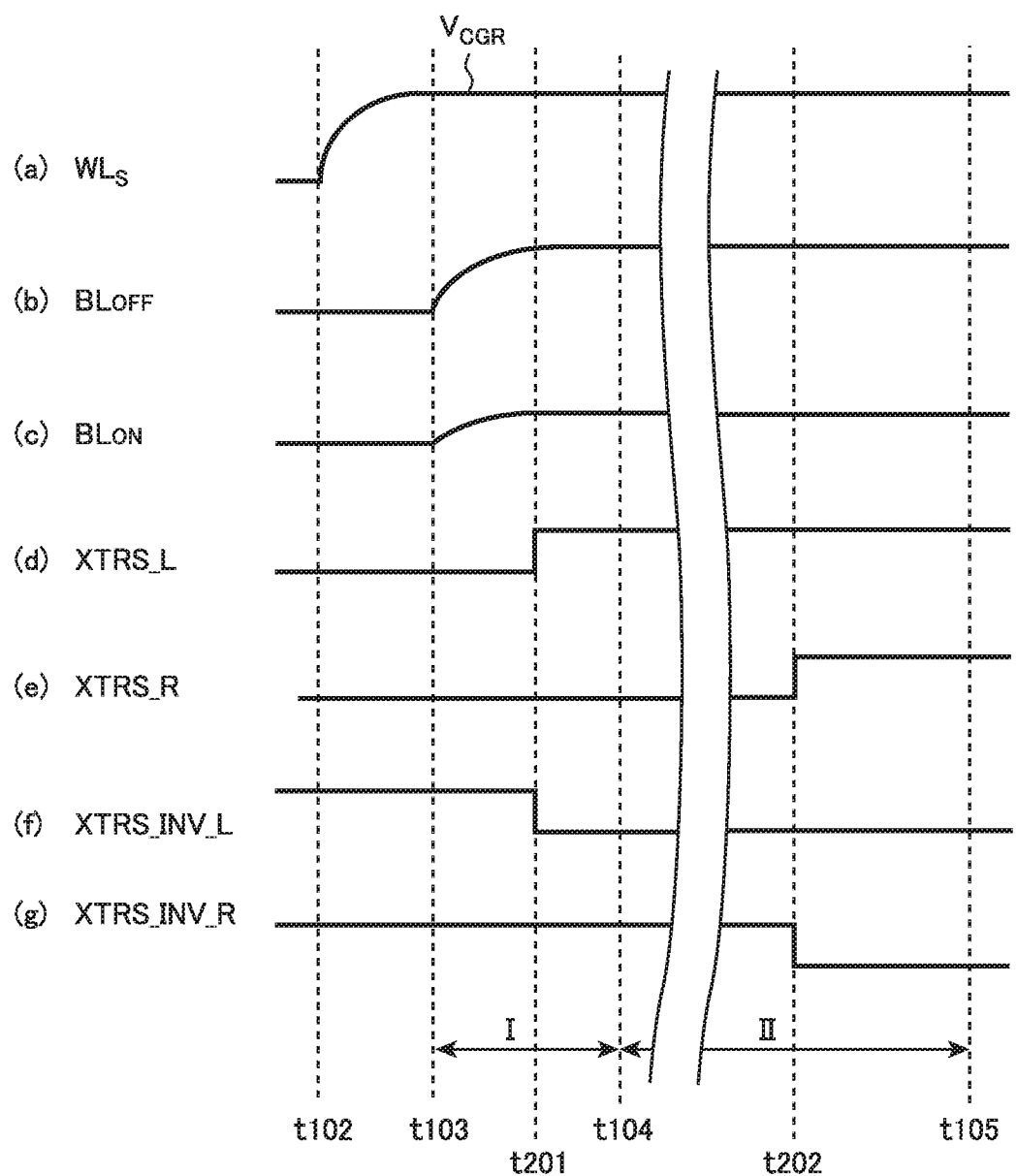
FIG. 20 is a schematic waveform diagram for describing a compensation of an asynchronous noise in the read operation.

For example, in the example of FIG. 20, in the charge period I, the operation at timing t201 described with reference to FIG. 19 is executed. In the sense operation period II, the operation at timing t202 described with reference to FIG. 19 is executed.

Second Embodiment

Next, the second embodiment will be described. A memory die MD according to the second embodiment is basically configured similarly to the memory die MD according to the first embodiment. However, while the first embodiment has an object to reduce the coupling noise generated at the bit line in the read operation, the second embodiment has an object to reduce the coupling noise generated at the bit line in the write operation.

[Description of Write Operation]

Figure 21:
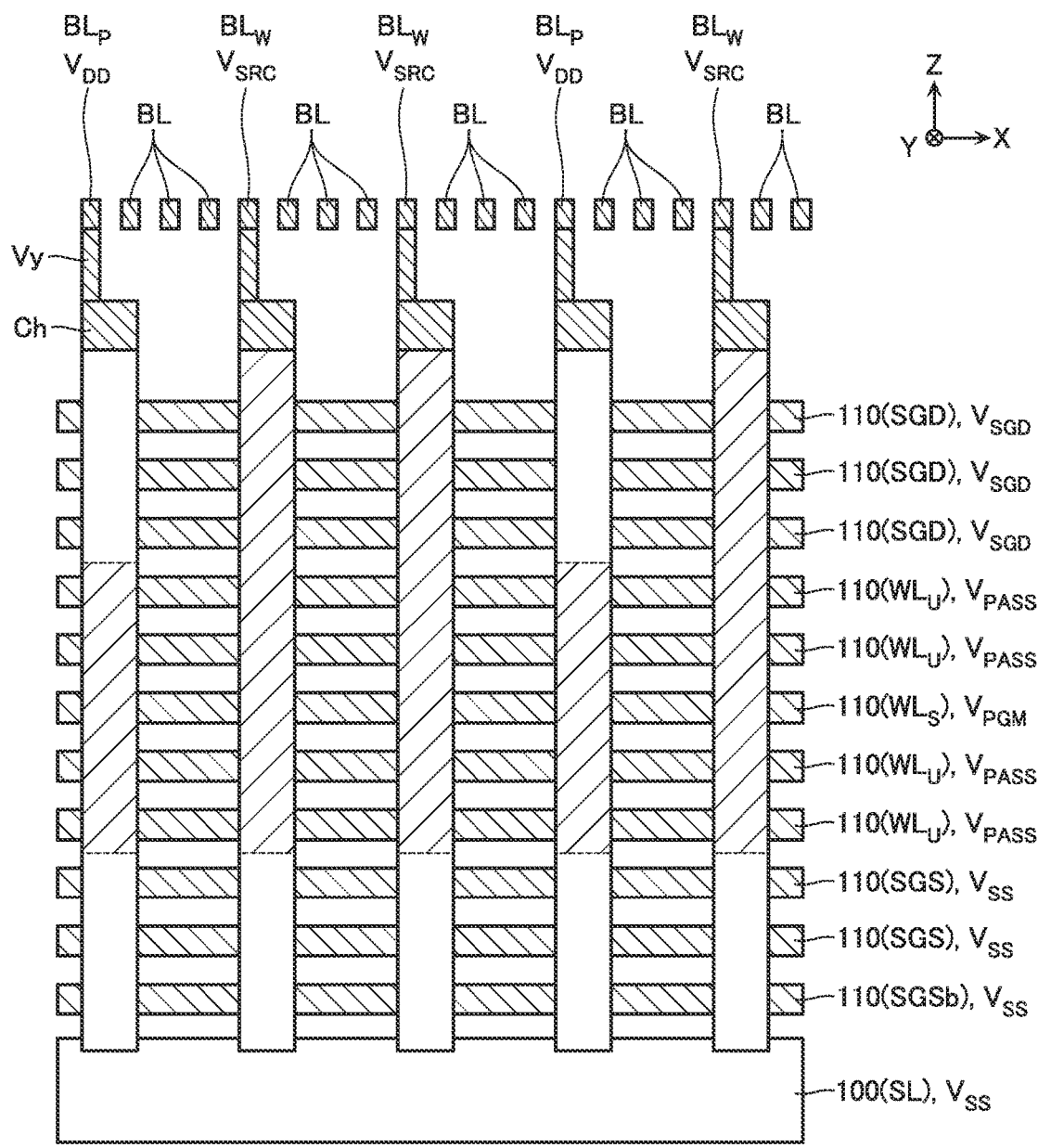
FIG. 21 is a schematic cross-sectional view for describing a write operation.
Figure 22:
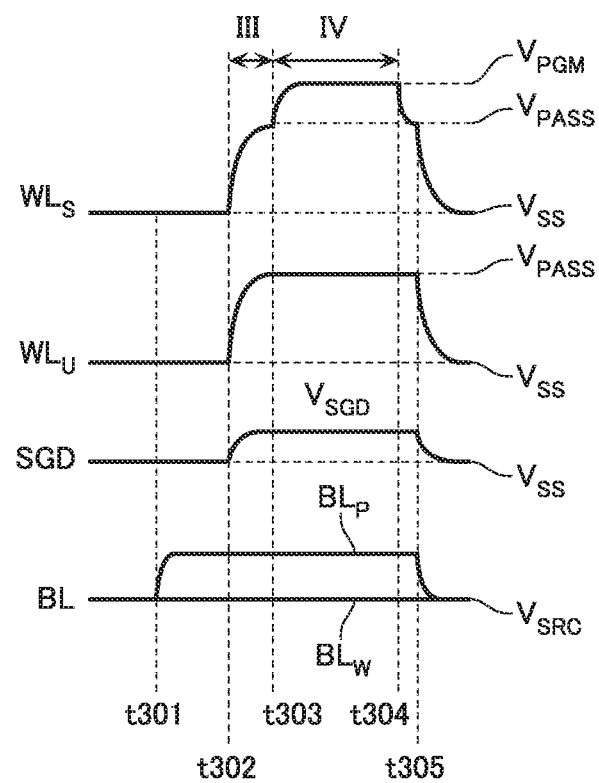
FIG. 22 is a schematic waveform diagram for describing the write operation.

FIG. 21 is a schematic cross-sectional view for describing the write operation. FIG. 22 is a schematic waveform diagram for describing the write operation.

At timing t301 of the write operation, for example, the voltage $V_{SRC}$ is supplied to a bit line $BL_W$ connected to the selected memory cell MC that performs an adjustment of the threshold voltage (hereinafter referred to as a "write memory cell MC" in some cases) among the plurality of selected memory cells MC, and the voltage $V_{DD}$ is supplied to a bit line $BL_P$ connected to the selected memory cell MC that does not perform the adjustment of the threshold voltage (hereinafter referred to as an "inhibited memory cell MC" in some cases) among the plurality of selected memory cells MC.

At timing t302 of the write operation, a write pass voltage $V_{PASS}$ is supplied to the selected word line $WL_S$ and the unselected word line $WL_U$. A voltage $V_{SGD}$ is supplied to the drain-side select gate line SGD. The write pass voltage $V_{PASS}$ has a magnitude that the memory cell MC is turned ON regardless of the threshold voltage of the memory cell MC. The voltage $V_{SGD}$ has a magnitude that the drain-side select transistor STD is turned ON or OFF corresponding to the voltage of the bit line BL.

Here, for example, as illustrated in FIG. 21, the bit line $BL_W$ is supplied with the voltage $V_{SRC}$. The voltage obtained by subtracting the voltage $V_{SRC}$ supplied to the bit line $BL_W$ from the voltage $V_{SGD}$ supplied to the drain-side select gate line SGD is greater than the threshold voltage of the drain-side select transistor STD. Therefore, the drain-side select transistor STD is turned ON. The voltage $V_{SRC}$ is supplied to a channel of the semiconductor column 120 connected to the bit line $BL_W$.

Meanwhile, the bit line $BL_P$ is supplied with the voltage $V_{DD}$. The voltage obtained by subtracting the voltage $V_{DD}$ supplied to the bit line $BL_P$ from the voltage $V_{SGD}$ supplied to the drain-side select gate line SGD is smaller than the threshold voltage of the drain-side select transistor STD. Therefore, the drain-side select transistor STD is turned OFF. The channel of the semiconductor column 120 connected to the bit line $BL_P$ becomes an electrically floating state. The electric voltage of the channel of the semiconductor column 120 connected to the bit line $BL_P$ is increased to, for example, approximately the write pass voltage $V_{PASS}$ by the capacitive coupling with the selected word line $WL_S$ and the unselected word line $WL_U$.

At timing t303 of the write operation, a program voltage $V_{PGM}$ is supplied to the selected word line $WL_S$. The program voltage $V_{PGM}$ is greater than the write pass voltage $V_{PASS}$.

Here, the voltage $V_{SRC}$ is supplied to a channel of the semiconductor column 120 connected to the bit line $BL_W$. Therefore, a relatively large electric field is generated between the channel of the semiconductor column 120 connected to the bit line $BL_W$ and the selected word line $WL_S$. This causes the electrons in the channel of the semiconductor column 120 to tunnel into the electric charge accumulating film 132 (FIG. 10) via the tunnel insulating film 131 (FIG. 10). This increases the threshold voltage of the write memory cell MC.

Meanwhile, the voltage of the channel of the semiconductor column 120 connected to the bit line $BL_P$ is approximately the write pass voltage $V_{PASS}$. Therefore, the electric field generated between the channel of the semiconductor column 120 connected to the bit line $BL_P$ and the selected word line $WL_S$ is smaller than the above-described electric field generated between the channel of the semiconductor column 120 connected to the bit line $BL_W$ and the selected word line $WL_S$. Therefore, the electrons in the channel of the semiconductor column 120 does not tunnel into the electric charge accumulating film 132 (FIG. 10). Accordingly, the threshold voltage of the inhibited memory cell MC does not increase.

In the following description, a period from timing t302 to timing t303 is referred to as a "charge period III" in some cases. A period from timing t303 to timing t304 is referred to as a "program operation period IV" in some cases.

[Influence of Coupling Noise in Write Operation]

As described above, the write operation and the data transfer operation are executable at independent timings (ansynchronous timings). Here, as described above, a capacitive coupling possibly occurs between the control signal transmission wirings $m1_{L0}$ to $m1_{L15}$, $m1_{R0}$ to $m1_{R15}$ and the inversion control signal transmission wirings $m1_{INVL}$, $m1_{INVR}$, and the bit lines BL intersecting (overlapping) with these wirings while being close thereto (see FIG. 16). Accordingly, when the data transfer operation is executed during the write operation, the voltage of the bit line $BL_P$ is decreased by the capacitive coupling, the drain-side select transistor STD connected to the bit line $BL_P$ is turned ON, and the threshold voltage of the inhibited memory cell MC possibly increases. The voltage of the bit line $BL_W$ is increased by the capacitive coupling, the drain-side select transistor STD connected to the bit line $BL_W$ is turned OFF, and the threshold voltage of the inhibited memory cell MC possibly does not increase.

[Noise Compensation in Write Operation]

Also in this embodiment, with the method similar to that in the first embodiment, the noise to the bit line BL caused by the capacitive coupling can be reduced.

The data cache inversion control signals XTRS_INV_L, XTRS_INV_R may be constantly generated when the data transfer operation is executed, or may be generated only when the data transfer operation is executed at a specific timing. For example, in at least one of the charge period III and the program operation period IV described with reference to FIG. 21, the data cache inversion control signals XTRS_INV_L, XTRS_INV_R may be generated.

Figure 23:
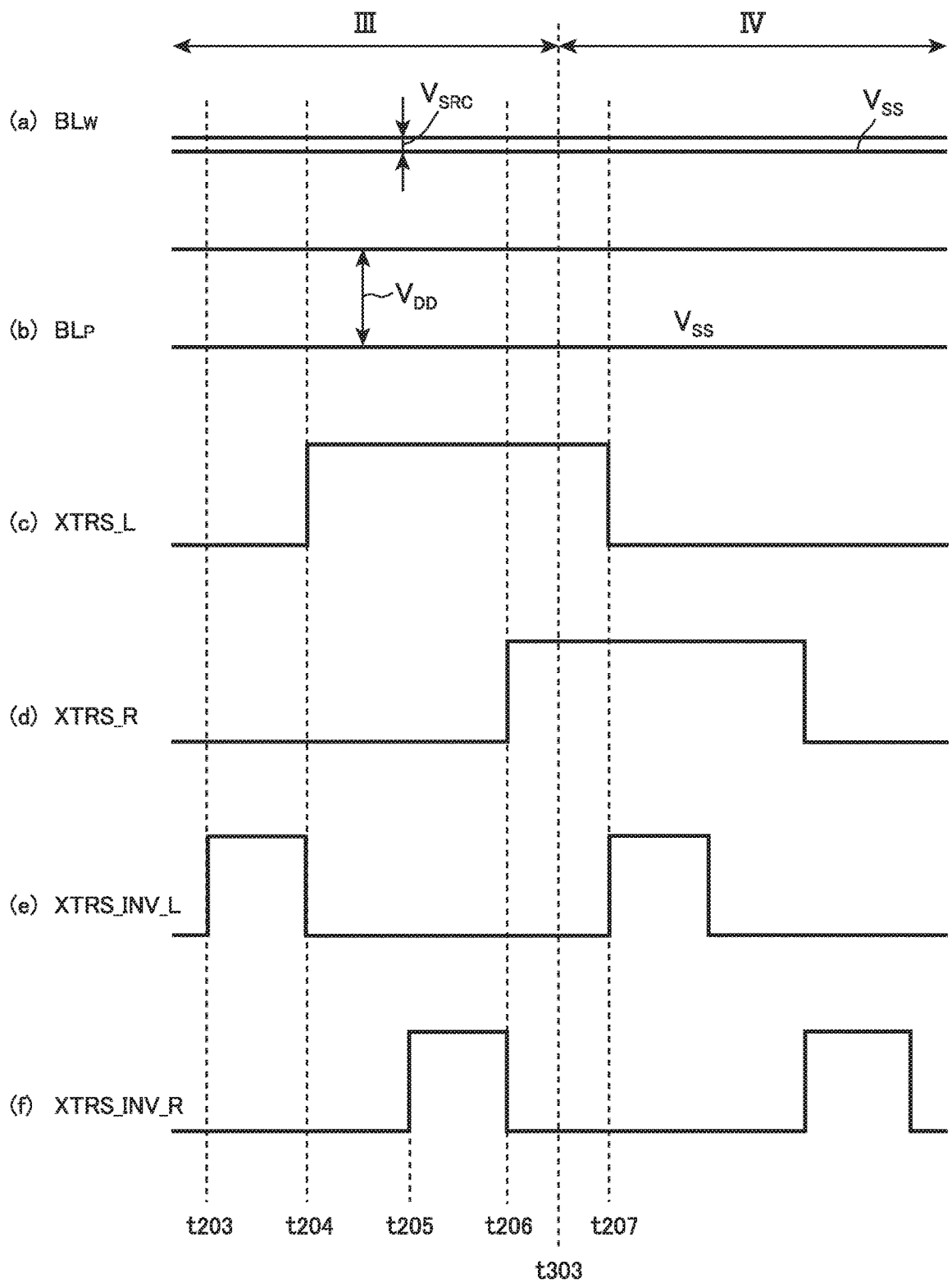
FIG. 23 is a schematic waveform diagram for describing a compensation of the asynchronous noise in the write operation.

For example, in the example of FIG. 23, in the charge period III, the operation from timing t203 to timing t206 described with reference to FIG. 19 is executed. In the program operation period IV, the operation at and after timing t207 described with reference to FIG. 19 is executed.

In the semiconductor memory device according to the second embodiment, similarly to the semiconductor memory device according to the first embodiment, in at least one of the charge period I and the sense operation period II described with reference to FIG. 18, the data cache inversion control signals XTRS_INV_L, XTRS_INV_R may be generated.

Other Embodiments

The semiconductor memory devices according to the first embodiment and the second embodiment have been described above. However, such semiconductor memory devices are merely examples, and specific configuration, operation, and the like are appropriately adjustable.

For example, the above-described semiconductor memory devices according to the first embodiment and the second embodiment each include one pair of the inversion control signal transmission wirings $m1_{INVL}$, $m1_{INVR}$ (two inversion control signal transmission wirings). However, for example, the semiconductor memory device according to the first embodiment or the second embodiment may include a plurality of pairs of the inversion control signal transmission wirings $m1_{INVL}$, $m1_{INVR}$. In such a case, the plurality of pairs of the inversion control signal transmission wirings $m1_{INVL}$, $m1_{INVR}$ may be decentrally disposed. For example, when the semiconductor memory device according to the first embodiment or the second embodiment includes seven pairs of the inversion control signal transmission wirings $m1_{INVL}$, $m1_{INVR}$, one pair of the inversion control signal transmission wirings $m1_{INVL}$, $m1_{INVR}$ may be disposed at every four control signal transmission wirings of the 32 control signal transmission wirings $m1_{L0}$ to $m1_{L15}$, $m1_{R0}$ to $m1_{R15}$.

In the first embodiment and the second embodiment described above, in the data transfer operation, the timing of inverting any of the data cache control signals XTRS_L<0> to XTRS_L<15>, XTRS_R<0> to XTRS_R<15> matches the timing of inverting any of the data cache inversion control signals XTRS_INV_L, XTRS_INV_R. However, these timings need not be strictly matched. From the aspect of the noise reduction, it is preferred that at least a part of the period from the start to the end of inverting the data cache control signals XTRS_L<0> to XTRS_L<15>, XTRS_R<0> to XTRS_R<15> overlaps at least a part of the period from the start to the end of inverting the data cache inversion control signals XTRS_INV_L, XTRS_INV_R.

In the first embodiment and the second embodiment described above, the coupling noise between the control signal transmission wirings $m1_{L0}$ to $m1_{L15}$, $m1_{R0}$ to $m1_{R15}$ and the bit line BL is reduced. However, the present invention is not limited thereto. For example, the present invention is applicable even to a case of reducing the coupling noise between any two wirings among the wirings m0, m1, and m2.

In the above-described embodiment, the coupling noise caused by the data cache control signal XTRS in which the signal state (H state, L state) varies asynchronously with the read operation and the write operation is reduced. However, the present invention is not limited thereto. For example, the present invention is applicable even to a case of reducing the coupling noise caused by the signal in which the signal state (H state, L state) varies in synchronization with the read operation and the write operation.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of first conductive layers arranged in a first direction intersecting with a surface of the substrate, the plurality of first conductive layers extending in a second direction intersecting with the first direction;
   a first semiconductor column extending in the first direction and being opposed to the plurality of first conductive layers;
   a first bit line extending in a third direction intersecting with the first direction and the second direction, the first bit line being disposed at a position overlapping the first semiconductor column viewed in the first direction;

a first wiring including a part overlapping the first bit line viewed in the first direction; and
a second wiring including a part overlapping the first bit line viewed in the first direction, wherein
when a predetermined period in which a voltage of the first wiring transitions from a high voltage state to a low voltage state is assumed to be a first period, and
when a predetermined period in which a voltage of the second wiring transitions from a low voltage state to a high voltage state is assumed to be a second period,
at least part of the second period overlaps at least a part of the first period.

2. The semiconductor memory device according to claim 1, wherein
when a predetermined period in which the voltage of the first wiring transitions from the low voltage state to the high voltage state after the first period is assumed to be a third period, and
when a predetermined period in which the voltage of the second wiring transitions from the high voltage state to the low voltage state after the second period is assumed to be a fourth period,
at least part of the fourth period overlaps at least a part of the third period.

3. The semiconductor memory device according to claim 2, comprising:
a third wiring including a part overlapping the first bit line viewed in the first direction, wherein
when a predetermined period in which a voltage of the third wiring transitions from a high voltage state to a low voltage state after the third period is assumed to be a fifth period, and
when a predetermined period in which the voltage of the second wiring transitions from the low voltage state to the high voltage state after the fourth period is assumed to be a sixth period,
at least part of the sixth period overlaps at least a part of the fifth period.

4. The semiconductor memory device according to claim 3, wherein
when a predetermined period in which the voltage of the third wiring transitions from the low voltage state to the high voltage state after the fifth period is assumed to be an seventh period,
when a predetermined period in which the voltage of the second wiring transitions from the high voltage state to the low voltage state after the sixth period is assumed to be an eighth period,
at least part of the eighth period overlaps at least a part of the seventh period.

5. The semiconductor memory device according to claim 3, wherein
the second wiring is disposed between the first wiring and the third wiring.

6. The semiconductor memory device according to claim 1, wherein
the first wiring and the second wiring extend in the second direction.

7. The semiconductor memory device according to claim 1, wherein
the first period and the second period are included in a period from a start of charging the first bit line to an end of a sense operation to the first bit line in a read operation.

8. The semiconductor memory device according to claim 1, wherein
the first period and the second period are included in a period from a start of charging the first bit line to an end of supplying a program voltage to any of the plurality of first conductive layers in a write operation.

9. The semiconductor memory device according to claim 1, wherein
the substrate includes a plurality of first regions and a plurality of second regions alternately arranged in the second direction,
a plurality of the first semiconductor columns are disposed in the plurality of first regions,
a plurality of first contacts are disposed in the plurality of second regions, the plurality of first contacts extending in the first direction, the plurality of first contacts having one ends in the first direction closer to the substrate than the plurality of first conductive layers, and the plurality of first contacts having other ends in the first direction farther from the substrate than the plurality of first conductive layers, and
the plurality of first conductive layers are disposed over the plurality of first regions and the plurality of second regions.

10. The semiconductor memory device according to claim 9, comprising
a first conversion circuit disposed on the substrate, wherein
the first wiring is electrically connected to the first conversion circuit via a second contact, and the second contact is one of the plurality of first contacts.

11. The semiconductor memory device according to claim 1, wherein
the substrate includes a third region disposed to be separated from the plurality of first regions and the plurality of second regions in the third direction, and
a plurality of third contacts are disposed in the third region, the plurality of third contacts extend in the first direction, the plurality of third contacts having one ends in the first direction are closer to the substrate than the plurality of first conductive layers, and the plurality of third contacts having other ends in the first direction are farther from the substrate than the plurality of first conductive layers.

12. The semiconductor memory device according to claim 11, comprising
a first control circuit disposed on the substrate, the first control circuit controlling an voltage of the first wiring, wherein
the first wiring is electrically connected to the first control circuit via a fourth contact, and the fourth contact is one of the plurality of third contacts.

13. The semiconductor memory device according to claim 12, comprising
a second control circuit disposed on the substrate, the second control circuit controlling an voltage of the second wiring, wherein
the second wiring is electrically connected to the second control circuit via a fifth contact, and the fifth contact is one of the plurality of third contacts.

14. The semiconductor memory device according to claim 1, comprising
a plurality of memory cells disposed between the plurality of first conductive layers and the first semiconductor column.

15. The semiconductor memory device according to claim 1, comprising:
- a latch circuit disposed on the substrate, the latch circuit latching data being transferred from the first bit line; and
- a first conversion circuit connected to the latch circuit, wherein
- the first wiring is electrically connected to the first conversion circuit.

16. The semiconductor memory device according to claim 1, comprising
- a first transistor disposed at a position on the substrate overlapping the first semiconductor column viewed in the first direction.

* * * * *